United States Patent
Gale et al.

(10) Patent No.: US 10,263,713 B2
(45) Date of Patent: Apr. 16, 2019

(54) LOCATION OF A SOURCE OF PASSIVE INTERMODULATION IN A FREQUENCY SELECTIVE DEVICE

(71) Applicant: AceAxis Limited, Harlow (GB)

(72) Inventors: Simon Gale, Harlow (GB); David Damian Nicholas Bevan, Harlow (GB); Fiona Wilson, Harlow (GB); Nigel Chapman, Harlow (GB)

(73) Assignee: AceAxis Limited, Harlow (GB)

( * ) Notice: Subject to any disclaimer, the term of this patent is extended or adjusted under 35 U.S.C. 154(b) by 0 days.

(21) Appl. No.: 15/812,382

(22) Filed: Nov. 14, 2017

(65) Prior Publication Data

US 2018/0219636 A1  Aug. 2, 2018

(30) Foreign Application Priority Data

Jan. 31, 2017  (GB) .................................. 1701600.7

(51) Int. Cl.
*H04B 17/00* (2015.01)
*H04B 17/20* (2015.01)
(Continued)

(52) U.S. Cl.
CPC ......... *H04B 17/0085* (2013.01); *H04B 17/20* (2015.01); *H04B 17/26* (2015.01); *G01R 23/20* (2013.01); *H04B 17/11* (2015.01)

(58) Field of Classification Search
USPC .................................. 455/67.11, 67.13, 63.1
See application file for complete search history.

(56) References Cited

U.S. PATENT DOCUMENTS

| 4,648,124 A | 3/1987 | Mantovani et al. |
| 8,131,239 B1 | 3/2012 | Walker et al. |

(Continued)

FOREIGN PATENT DOCUMENTS

| GB | 2502279 A | 11/2013 |
| GB | 2502281 A | 11/2013 |

(Continued)

OTHER PUBLICATIONS

United Kingdom Search Report dated Apr. 3, 2017 issued for related Application No. GB Application No. GB 1701600.7 filed Jan. 31, 2017.

(Continued)

*Primary Examiner* — Fayyaz Alam
(74) *Attorney, Agent, or Firm* — EIP US LLP

(57) ABSTRACT

A location is identified of at least one PIM (passive intermodulation) source in a frequency selective device by applying an excitation waveform to the frequency selective device and measuring a PIM response signature of the frequency selective device. The PIM response signature is a characteristic of PIM produced in response to the excitation waveform. The measured PIM response signature is compared with each of a plurality of example PIM response signatures, each of the plurality of example PIM response signatures corresponding to a characteristic of PIM expected for a respective location of a PIM source in the frequency selective device. The location of the at least one PIM source within the frequency selective device is determined on the basis of the comparison.

20 Claims, 20 Drawing Sheets

(51) Int. Cl.
  *H04B 17/26* (2015.01)
  *G01R 23/20* (2006.01)
  *H04B 17/11* (2015.01)

(56) References Cited

U.S. PATENT DOCUMENTS

| | | | | |
|---|---|---|---|---|
| 8,666,322 B1* | 3/2014 | Bradley | ............... | H04B 17/11 |
| | | | | 324/612 |
| 9,455,792 B1* | 9/2016 | Truesdale | ............ | H04B 17/104 |
| 9,906,246 B2* | 2/2018 | Kang | ................... | H04B 1/1027 |
| 2009/0239475 A1* | 9/2009 | Lehman | ................ | H04B 1/109 |
| | | | | 455/67.13 |
| 2015/0087242 A1* | 3/2015 | Bain | ................. | H04B 17/3913 |
| | | | | 455/73 |
| 2016/0157115 A1* | 6/2016 | Kim | .................... | H04W 24/08 |
| | | | | 455/423 |
| 2016/0366605 A1* | 12/2016 | Tsui | .................... | H04W 24/08 |
| 2017/0019279 A1* | 1/2017 | Tobisu | ............... | H04L 27/2697 |
| 2017/0230129 A1* | 8/2017 | Yoo | ....................... | H04W 24/06 |
| 2017/0237484 A1* | 8/2017 | Heath | ............. | H04B 10/07953 |
| | | | | 398/26 |

FOREIGN PATENT DOCUMENTS

| | | |
|---|---|---|
| GB | 2517298 A | 2/2015 |
| WO | 2012126056 A1 | 9/2012 |
| WO | 2015166308 A1 | 11/2015 |

OTHER PUBLICATIONS

Aleksey P Shitvov et al: "Passive Intermodulation Generation on Printed Lines: Near-Field Probing and Observations." IEEE Transactions on Microwave Theory and Techniques, Plenum, USA vol. 56 No. 12.

International Search Report and Written Opinion dated May 29, 2018 on related International Application No. PCT/GB2018/050282 filed Jan. 31, 2018.

* cited by examiner

LOCATION OF A SOURCE OF PASSIVE INTERMODULATION IN A FREQUENCY SELECTIVE DEVICE

CROSS-REFERENCE TO RELATED APPLICATIONS

This application claims priority to United Kingdom Application No. GB 1701600.7 filed Jan. 31, 2017, under 35 U.S.C. § 119(a). The above-referenced patent application is incorporated by reference in its entirety.

BACKGROUND OF THE INVENTION

Field of the Invention

The present invention relates generally to methods and apparatus for location of a source of passive intermodulation (PIM) in a frequency selective device. The frequency selective device may be typically, but is not limited to being, a filter or duplexer for use at radio frequency in a wireless communication system, typically for use at a base station of a cellular wireless system.

Description of the Related Technology

Passive intermodulation (PIM) may be generated in a wireless network when one or more signals are transmitted along a signal path including a passive component having a non-linear transmission characteristic. PIM products typically differ in frequency from the signal or signals from which they were generated, and may potentially cause interference to other signals. The generation of non-linear products is becoming a problem of increasing importance in modern wireless communication systems, and in particular cellular wireless systems, since the radio frequency spectrum available has been steadily expanded as additional bands have become available, and the pattern of allocation of uplink and downlink bands within the available spectrum for use by various cellular systems, such systems using GERAN (GSM EDGE Radio Access Network), UTRAN (UMTS Terrestrial Radio Access Network) and E-UTRAN (Evolved UMTS Terrestrial Radio Access Network) radio access networks, and by various operators, is complex and territorially dependent. In this environment, and in particular at a cellular radio base station, it is likely that circumstances arise in which non-linear products generated from transmitted carriers in one or more downlink bands would fall as interference within an uplink band in which signals are received at the base station. This interference may limit the capacity of the radio system, and so it is important to minimise the level of PIM generated in a wireless system. Many frequency selective devices such as filters and duplexers exhibit a non-linear transmission characteristic to some degree which may generate PIM, for example due to an oxide layer at a metal to metal contact, or as a result of metallic swarf inadvertently being introduced into the component during manufacture. There is typically a complex structure within a frequency selective device such as a filter or diplexer, which typically includes many resonators, which may be cavity resonators or lumped element resonators, for example. There are many locations within the frequency selective device at which a non-linear effect may occur, acting as a source of PIM. For example, a grounding connection of one or more of the resonators may be generating PIM, or a coupling between resonators, or many other potential locations within the frequency selective device.

It may be desired to locate a PIM source within the frequency selective device for diagnosis of a fault condition, or as a factory test, for example. Existing methods of locating PIM in a signal path involve using a swept frequency excitation and deriving a distance between the PIM source and the receiver from a delay value derived from the phase gradient of the received PIM. This technique may be useful to detect sources of PIM in the wireless propagation path, such as a PIM source on a rusty part of an antenna tower, but such techniques can suffer from limited distance resolution and so may not be suitable for location of a PIM source within a device.

It is an object of the invention to address at least some of the limitations of the prior art systems.

SUMMARY

In accordance with a first aspect of the present invention there is provided a method of identifying a location of at least one PIM (passive intermodulation) source in a frequency selective device comprising: applying an excitation waveform to the frequency selective device; measuring a PIM response signature of the frequency selective device, the PIM response signature being a characteristic of PIM produced in response to the excitation waveform; comparing the measured PIM response signature with each of a plurality of example PIM response signatures, each of the plurality of example PIM response signatures corresponding to a characteristic of PIM expected for a respective location of a PIM source in the frequency selective device; and identifying the location of the at least one PIM source within the frequency selective device on the basis of said comparing.

This allows the location of a PIM source within the frequency selective device to be accurately identified, by selection of the example PIM response signature which is closest to the measured PIM response signature, and taking the location to which the selected example PIM response signature relates as the identified location of the PIM source. The frequency selective device may be, for example, a radio frequency filter.

In an embodiment of the invention, the excitation waveform comprises a first and a second signal, wherein at least one of the first and second signals is a swept frequency continuous wave signal.

This provides a convenient excitation waveform with which to generate frequency swept PIM components, which may be received and processed efficiently to produce a PIM response signature in the frequency domain.

In an embodiment of the invention, the measured PIM response signature and each of the plurality of example PIM response signatures represents a frequency domain characteristic.

This allows an efficient signal processing implementation, for example using a swept frequency source.

In an embodiment of the invention, said comparing comprises generating a respective measure of a degree of matching between the measured PIM response signature and each of the plurality of example PIM response signatures.

This allows selection of the example PIM response signature having the best match to the measured PIM response signature.

In an embodiment of the invention, the measure of the degree of matching is a mean squares difference between frequency characteristics in amplitude and/or phase.

This provides an efficient implementation.

In an embodiment of the invention, measuring the PIM response signature comprises: down-converting the PIM produced in response to the excitation waveform to a complex baseband signal; and multiplying the complex baseband signal by a counter-rotating vector to remove a frequency sweep in the PIM.

This allows the effects of phase rotation due to the sweeping to be removed, so that the underlying PIM response may be used.

In an embodiment of the invention, the PIM response signature comprises the complex baseband signal multiplied by the counter-rotating vector.

This provides a convenient form of PIM response signature.

In an embodiment of the invention, the PIM response signature comprises a group delay characteristic, the group delay characteristic being derived from the complex baseband signal multiplied by the counter-rotating vector.

This provides an alternative form for the PIM response signature, which may be useful for distinguishing between PIM source locations.

In an embodiment of the invention, the excitation waveform comprises at least a first modulated signal.

This may allow multiple PIM sources within the frequency selective device to be located. The modulated signal may be conveniently modulated with, for example, a spread spectrum direct sequence pseudo-random code, or an OFDM or SC-FDMA modulation.

In an embodiment of the invention, the first modulated signal occupies more than 10% of a passband of the frequency selective device.

This provides a good basis for a cross-correlation process.

In an embodiment of the invention, the first modulated signal occupies substantially the whole passband of the frequency selective device.

This provides a convenient implementation.

In an embodiment of the invention, the first modulated signal includes frequencies in a lower frequency cut-off region of a filter characteristic of the frequency selective device, wherein the excitation waveform comprises a second modulated signal including frequencies in an upper frequency cut-off region of a filter characteristic of the frequency selective device, and wherein the excitation waveform comprises an unoccupied frequency band between the first and second modulated signals.

This may emphasise differences between PIM response signatures at different locations, because differences in the response may be greater at the edges of the pass band of the frequency selective device.

In an embodiment of the invention, the measured PIM response signature and each of the plurality of example PIM response signatures represents a time domain characteristic.

This allows efficient generation of PIM response signatures based on an excitation signal comprising a modulated signal.

In an embodiment of the invention, the comparing of the measured PIM response signature with the example PIM response signatures comprises performing a cross-correlation between the measured PIM response signature and each of the plurality of example PIM response signatures.

This provides an efficient method of comparing time domain PIM response signatures.

In an embodiment of the invention, the plurality of example PIM response signatures are measured results determined from frequency selective devices having respective PIM sources located at known locations within the respective frequency selective devices.

This allows accurate identification of known fault conditions of the frequency selective device.

In an embodiment of the invention, the plurality of example PIM response signatures are simulated results determined from simulations of frequency selective devices having respective PIM sources located at known locations within the respective frequency selective devices.

This allows simulated results for a large number of hypothetical locations of PIM sources to be generated.

In embodiments of the invention, the frequency selective device may be a filter, a duplexer, a combiner, an antenna, or another frequency selective device.

In an embodiment of the invention, the excitation waveform comprises an excitation signal applied to a first port of the frequency selective device and a second excitation signal applied to a second port of the frequency selective device.

This allows improved discrimination between PIM response signatures for each location.

In an embodiment of the invention, the excitation waveform is applied to a first port of the frequency selective device, a second port of the frequency device is grounded, and a PIM response signature is measured based on PIM signals emitted from the first port. This allows improved discrimination between PIM response signatures for each location.

In an embodiment of the invention, the excitation waveform is applied to a feed port of the antenna, and a grounded conductive plate is placed in the radiating path of the antenna in order to reflect radiated signals back into the antenna, and the PIM response signature is measured based on PIM signals emitted from the feed port. This allows efficient testing of an antenna for sources of PIM.

In accordance with a second aspect of the invention, there is provided test apparatus for identifying a location of at least one PIM (passive intermodulation) source in a frequency selective device, the test apparatus comprising: a signal generator configured to generate an excitation waveform for application to the frequency selective device; a receiver configured to receive PIM produced in the frequency selective device in response to the excitation waveform; and a circuit comprising a processor configured to: measure a PIM response signature of the frequency selective device, the PIM response signature being a characteristic of the PIM received by the receiver; produce comparison results by comparing the measured PIM response signature with each of a plurality of example PIM response signatures, each of the plurality of example PIM response signatures corresponding to a characteristic of PIM expected for a respective location of a PIM source in the frequency selective device; and identify the location of the at least one PIM source within the frequency selective device on the basis of the comparison results.

Further features and advantages of the invention will be apparent from the following description of preferred embodiments of the invention, which are given by way of example only.

DETAILED DESCRIPTION OF CERTAIN INVENTIVE EMBODIMENTS

By way of example, embodiments of the invention will now be described in the context of identifying a location of at least one PIM (passive intermodulation) source in a frequency selective device such as a filter, duplexer, combiner or antenna, for use in in cellular wireless networks such as GSM, 3G (UMTS) and LTE (Long Term Evolution) networks comprising GERAN, UTRAN and/or E-UTRAN radio access networks, but it will be understood that embodiments of the invention may relate to other types of frequency selective device and to other types of radio access network, and that embodiments of the invention are not restricted to cellular wireless systems.

In a cellular wireless network, PIM may be generated in a component due to a passive non-linear characteristic, albeit a relatively weak non-linear characteristic. The non-linear characteristic may be caused by an oxide layer between metallic parts, for example in a device in the propagation environment outside the radio head, and/or in a filter, duplexer, combiner or antenna of the radio head. The device may be impinged upon by the downlink transmitted signals, and then the generated PIM may be retransmitted or reflected. The generation of PIM is by radio frequency mixing between, in this example, the two signals at frequencies $f_1$ and $f_2$, or between different frequency components of a modulated signal, such as an OFDM signal, which may be relatively wideband, occupying for example 10% or more of the passband of a frequency selective device. As a result of the radio frequency mixing, PIM product may be generated at various frequencies, but it is PIM products which fall at a frequency in a receive band of the cellular wireless system which may be problematic, since the PIM may be received as interference. PIM products generated by intermodulation within a wideband modulated signal may fall within or adjacent to the signal bandwidth and so may be seen as interference. For example, PIM products may be third order products appearing at frequencies $2f_1-f_2$ and $2f_2-f_1$.

Examples of frequency selective devices which may exhibit PIM are filters, duplexers (also known as diplexers), combiners and antennas. These devices are frequency selective in that their transfer characteristics in amplitude and/or phase vary significantly across a band in which PIM products of interest may be excited or generated. Filters and duplexers typically have a pass-band by design, and may have amplitude and phase characteristics which vary rapidly in the cut-off regions of the filter at the band edges. Combiners, in particular cavity combiners, may also typically have a frequency dependent transfer characteristic. Antennas may be designed to be broadband, but inevitably have frequency dependent transfer characteristics. The internal construction of the frequency dependent devices may be complex, with the potential to generate PIM at various locations within the devices.

Figure 1:
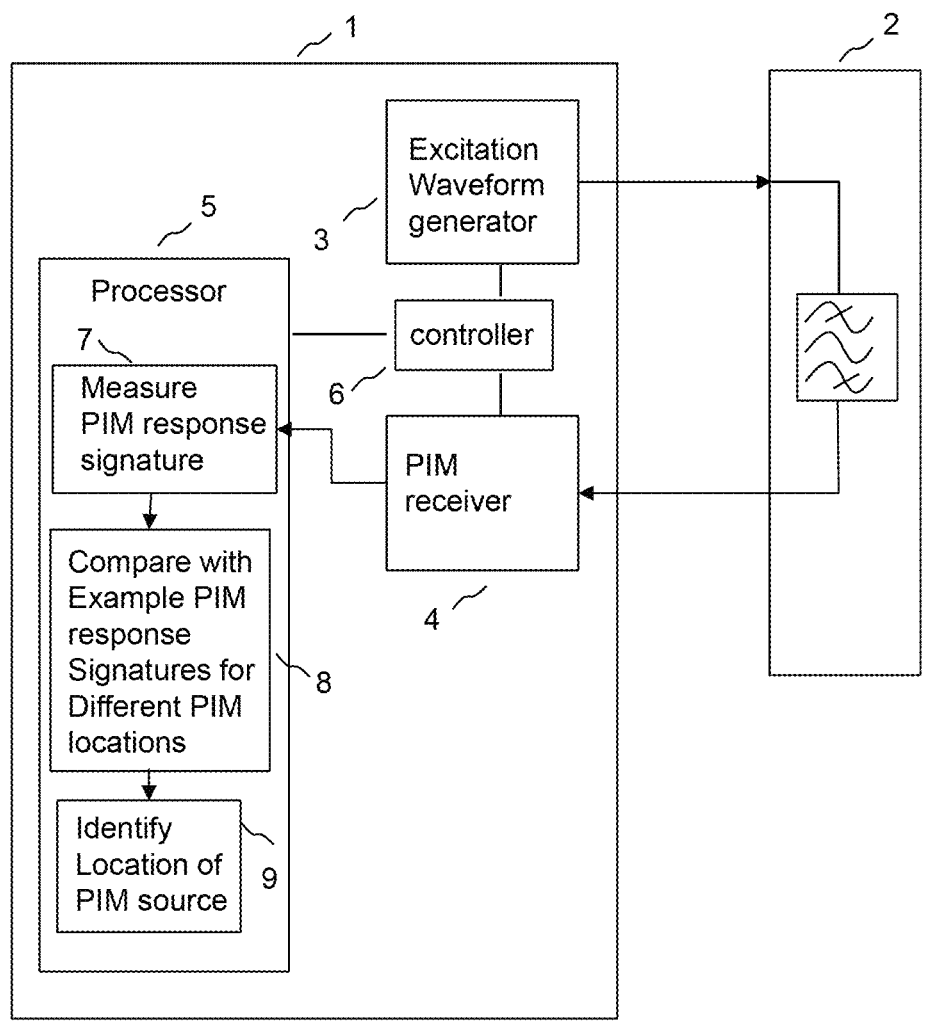
FIG. 1 is a schematic diagram showing test equipment in an embodiment of the invention connected to a device under test (DUT) which is a frequency selective device such as a filter or duplexer.

FIG. 1 shows test equipment 1 in an embodiment of the invention for identifying a location of at least one PIM source in a frequency dependent device 2. The test equipment may be, for example, used in the field to diagnose a fault in the frequency selective device, or may be used in a factory for production testing or development of low PIM frequency dependent devices. The device under test (DUT) 2 shown in FIG. 1 may be, for example, a filter or duplexer.

As shown in FIG. 1, an excitation waveform is generated in the excitation waveform generator 3, which may also be referred to as a signal generator, and is applied to the frequency selective device 2 that is under test.

A radio receiver 4 is also connected to the frequency selective device 2 under test, and is configured to receive PIM produced in the frequency selective device in response to the excitation waveform. The receiver may be a conventional radio receiver, for example comprising a downconverter stage for mixing the signal received at radio frequency to a complex baseband representation.

Also as shown in FIG. 1, the test equipment comprises a signal processing circuit comprising a processor 5 configured to measure 7 a PIM response signature of the frequency selective device, the PIM response signature being a characteristic of PIM produced in response to the excitation waveform, and to compare 8 the measured PIM response signature with each of a plurality of example PIM response signatures, each of the plurality of example PIM response signatures corresponding to a characteristic of PIM expected for a respective location, or multiple locations, of a PIM source in the frequency selective device. The location of the at least one PIM source within the frequency selective device is then identified 9 on the basis of the comparison. This allows the location of a PIM source within the frequency selective device to be accurately identified, by selection of the example PIM response signature which is closest to the measured PIM response signature, and taking the location to which the selected example PIM response signature relates as the identified location of the PIM source.

The signal processing circuit comprising a processor 5 may be implemented using well known technology for implementing digital signal and control functions, for example as a programmable logic array, a digital signal processing chip, or the method may be performed in software, using program code held in memory and causing a processor to implement the method. The controller 6 shown in FIG. 1 may be part of the processor 5, and may perform scheduling and control functions.

Figure 2:
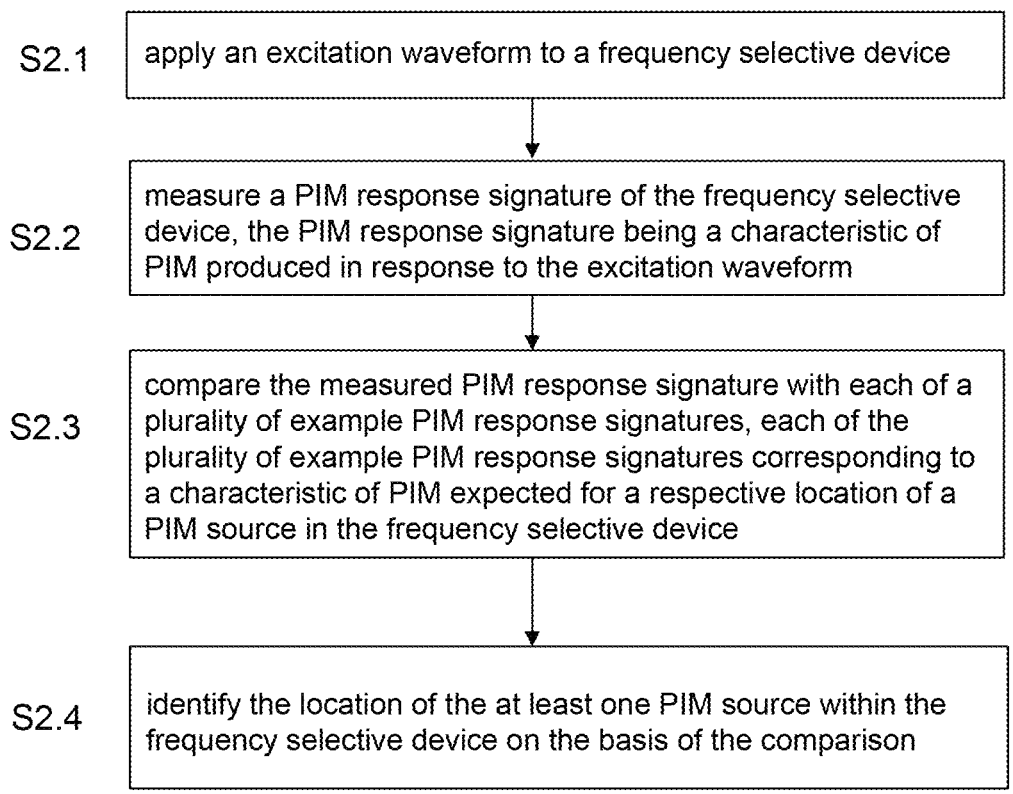
FIG. 2 is a flow diagram of a method of identifying a location of at least one PIM source in a frequency selective device in an embodiment of the invention.

FIG. 2 is a flow chart showing a method which may be performed by the test apparatus in an embodiment of the invention according to steps S2.1, S2.2, S2.3 and S2.4.

Figure 3:
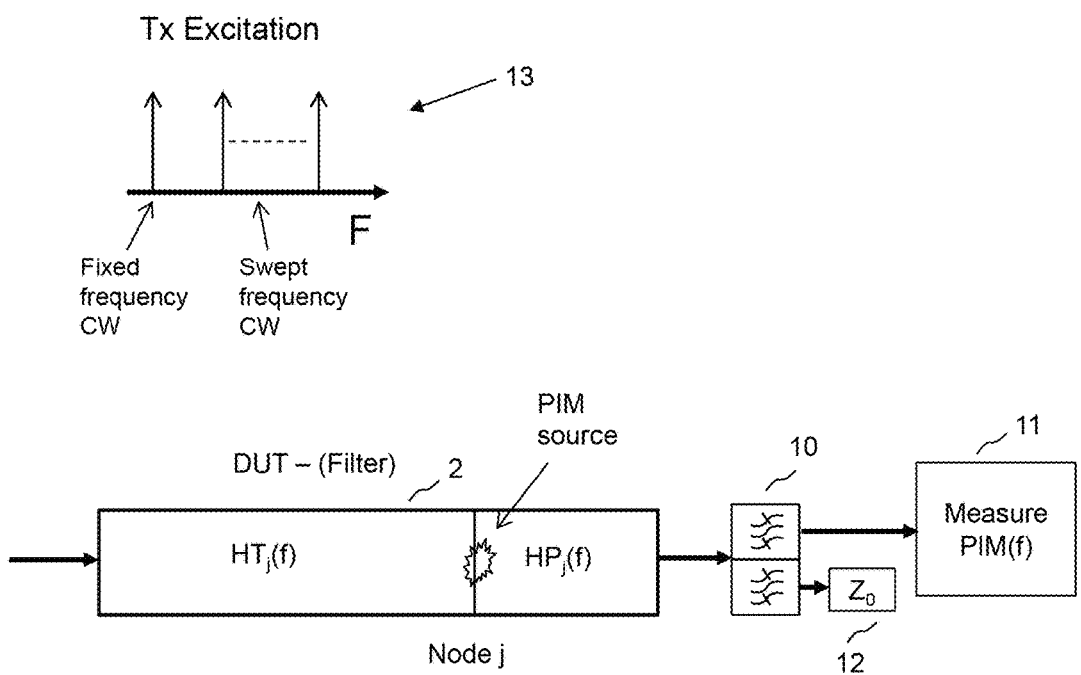
FIG. 3 is a schematic diagram showing a swept frequency excitation waveform, a frequency selective device under test having frequency selective transfer functions preceding and following a single PIM source, and test apparatus for receiving and measuring the generated PIM as a function of frequency in an embodiment of the invention.

FIG. 3 shows an example of the excitation waveform 13, in an embodiment of the invention, in which the excitation waveform comprises a first and a second signal. In this example, the second signal is a swept frequency continuous wave (CW) signal, that is to say an unmodulated signal, and the first signal is a fixed frequency CW signal. The swept waveform may be stepped. The excitation waveform 13 is applied to a frequency selective device under test 2, in this example a filter. The frequency selective device 2 has a frequency selective transfer function $HT_f(f)$ preceding a single PIM source in this example, and a second frequency selective transfer function $HP_f(f)$ following the PIM source. The output signals from the frequency selective device, including the excitation waveform, as modified slightly by the overall filter transfer function, and the PIM generated in the PIM source, are output from the device and applied to diplexer 10, which is part of the test equipment. This routes the excitation signal (typically at downlink frequencies) to a termination 12 of the same characteristic impedance as the duplexer, $Z_0$, and routes the generated PIM (typically at uplink frequencies) to the receiver input of the measurement circuit 11 of the test apparatus. In the embodiment of FIG. 3, the measured PIM response signature and each of the example PIM response signatures represents a frequency domain characteristic.

Figure 4:
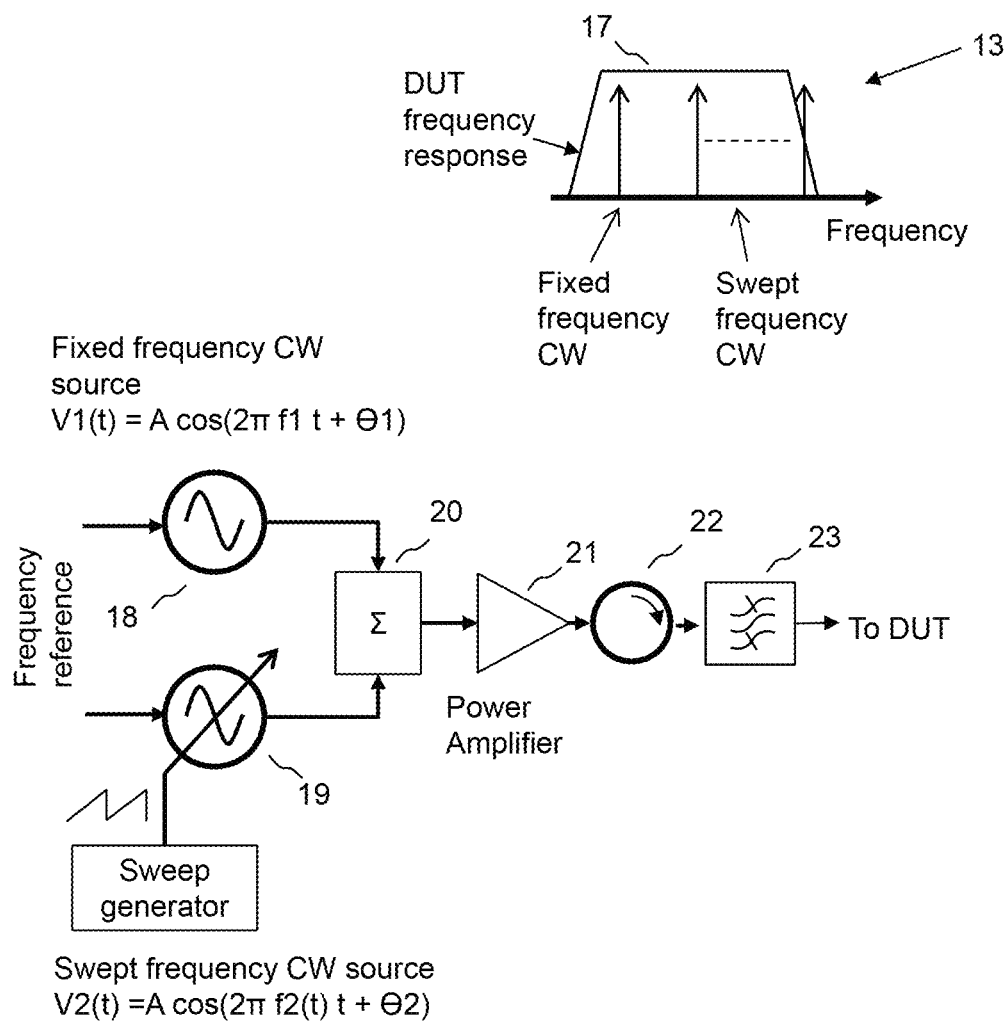
FIG. 4 is a schematic diagram showing generation of a swept signal excitation waveform in an embodiment of the invention.
Figure 5:
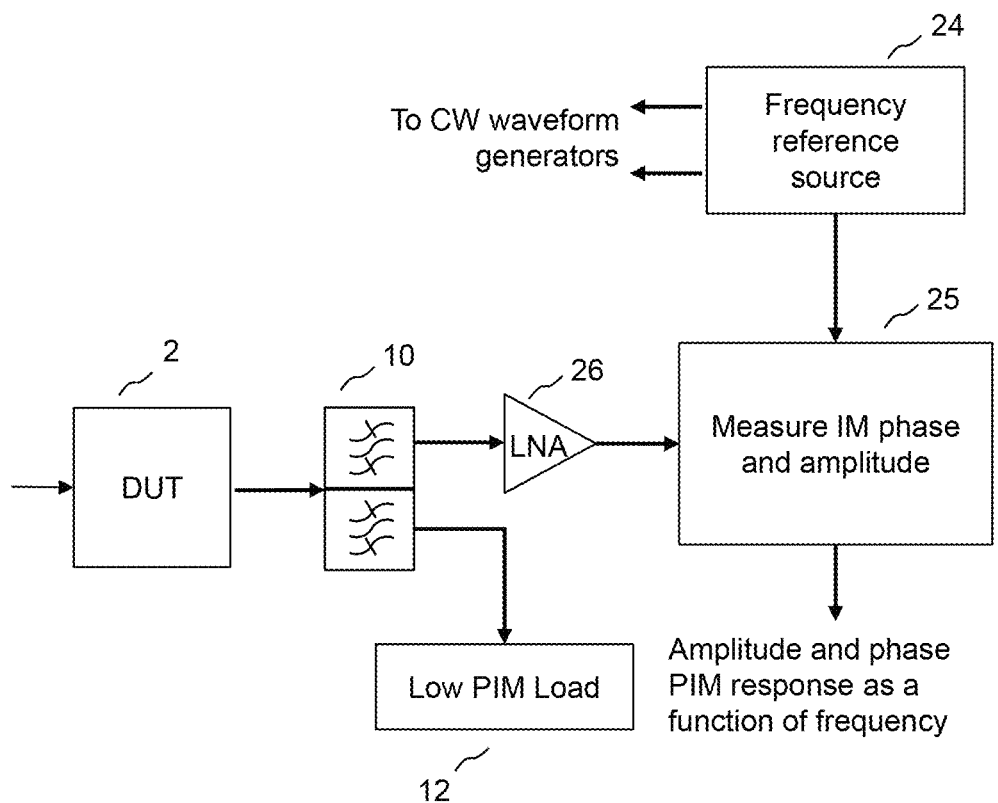
FIG. 5 is a schematic diagram showing application of the swept signal excitation waveform of FIG. 4 to the frequency selective device under test, and measurement of the PIM response signature as an amplitude and phase PIM response as a function of frequency in an embodiment of the invention.
Figure 6:
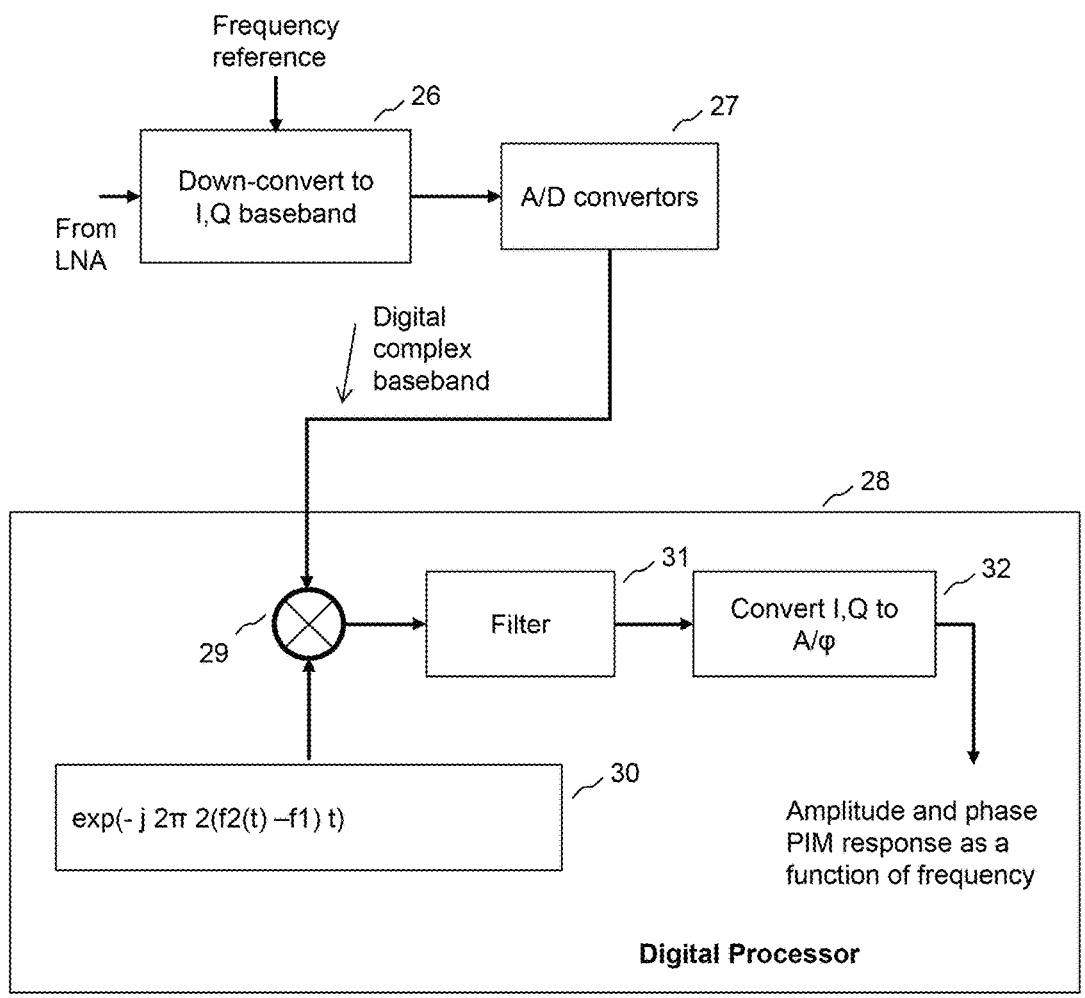
FIG. 6 is a schematic diagram showing an example of the implementation of the amplitude and phase PIM response shown in FIG. 5 in an embodiment of the invention.

FIGS. 4, 5 and 6 show in more detail the embodiment in which the PIM response signatures represent a frequency domain characteristic.

FIG. 4 shows an example of generation of a swept signal excitation waveform in an embodiment of the invention. Signals from a fixed frequency unmodulated source 18 and a sweep generator 19 are summed together in a combiner 20, amplified in a power amplifier 21, passed through a circulator 22 and then filtered in a filter 23 to remove intermodulation products that may be introduced by the power amplifier, and then passed to the device under test. The generated waveform 13, is shown in relation to the frequency response 17, that is to say pass band characteristic, of the frequency selective device under test. The fixed and swept frequency sources are provided with a reference frequency from a reference frequency source 24, as shown in FIG. 5.

FIG. 5 shows application of the swept signal excitation waveform of FIG. 4 to the frequency selective device under test 2, and measurement 25 of the PIM response signature as an amplitude and phase PIM response as a function of frequency. The same frequency source 24 is used as a reference frequency for the measurement circuit as is used to generate the excitation waveform. This prevents offsets in the measured PIM response signature due to frequency errors between the transmitter and the receiver.

FIG. 6 shows an example of the implementation of the measurement function 25. In the embodiment shown in FIG. 6, measuring the PIM response signature comprises downconverting 26 the PIM produced in response to the excitation waveform to a complex baseband signal, by means of a conventional downconverter circuit and analogue to digital converter 27. The complex baseband signal is multiplied using a complex multiplier 29 by a counter-rotating vector, generated by a signal generator 30, typically referenced to the reference frequency source 24, to remove a frequency sweep in the PIM. This may, for example, removes a frequency sweep appropriate to a lower third order PIM component, if this component is of interest for PIM measurements. This allows the effects of phase rotation due to the sweeping to be removed, so that the underlying PIM response may be used. The PIM response signature may comprise the complex baseband signal multiplied by the counter-rotating vector. As shown in FIG. 6, the PIM response signature may be filtered 31 to remove spurious mixer components and converted 32 to an amplitude and phase representation rather than inphase and quadrature, to provide a convenient form of PIM response signature. The baseband processing may be performed by a digital processor, which may be implemented using well known techniques for implementing a digital processor, such as one or more digital signal processing chips, a programmable gate array, or in software, or as a combination of these techniques.

In the embodiment of FIG. 6, the comparison between the measured PIM response signature and the example PIM response signatures comprises generating a respective measure of a degree of matching between the measured PIM response signature and each of the plurality of example PIM response signatures, to allows selection of the example PIM response signature having the best match to the measured PIM response signature. The measure of the degree of matching may be, for example, a mean squares difference between frequency characteristics in amplitude and/or phase.

Figure 7:
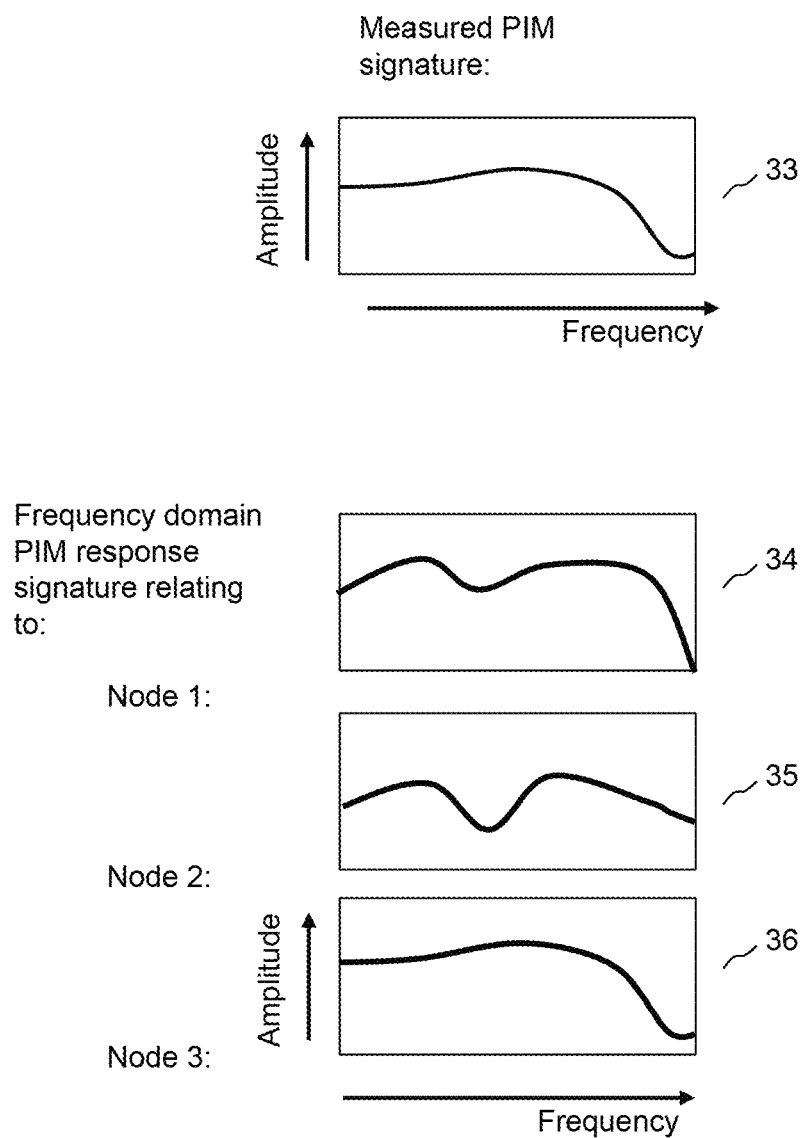
FIG. 7 shows a schematic representation of a measured PIM response signature in the frequency domain and example PIM response signatures in the frequency domain in an embodiment of the invention.

FIG. 7 shows a schematic representation of a measured PIM response signature 33 in the frequency domain and example PIM response signatures 34, 35, 36 in the frequency domain. It can be seen that in this case, the example PIM response signature for the source at Node 3 has the best match to the measured PIM response signature. Accordingly, Node 3 would be selected on this basis as the most likely location of the source of PIM.

In an alternative embodiment of the invention, the PIM response signature may comprise a group delay characteristic, the group delay characteristic being derived from the complex baseband signal of FIG. 6 multiplied by the counter-rotating vector 30. The group delay may be derived from the phase as a function of frequency. This provides an alternative form for the PIM response signature, which may be useful for distinguishing between PIM source locations.

Figure 8:
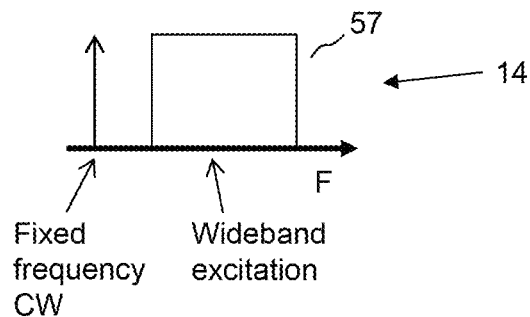
FIG. 8 is a schematic diagram showing a modulated signal wideband excitation waveform, a frequency selective device under test having respective frequency selective transfer functions preceding and following each of two PIM sources at different locations, and test apparatus for receiving and measuring the generated PIM as a time waveform in an embodiment of the invention.
Figure 8:
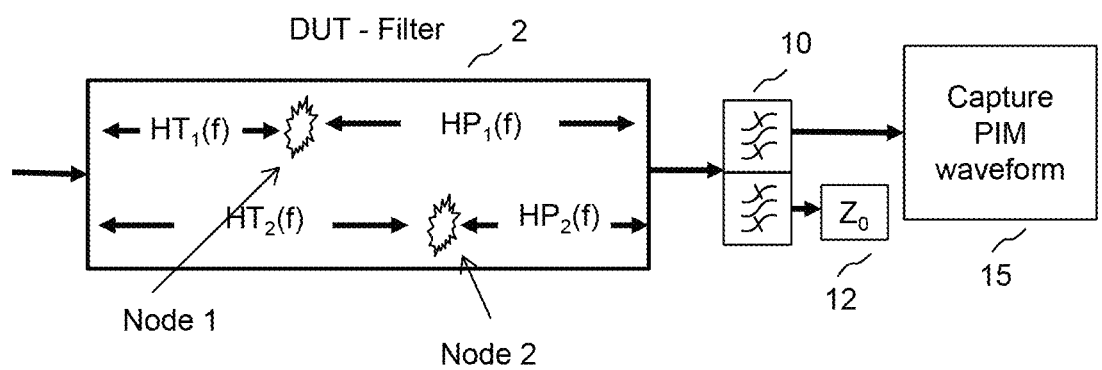

FIG. 8 shows an alternative embodiment to that of FIGS. 3 to 7, in which the excitation waveform 14 comprises at least one modulated signal, shown in FIG. 8 in the frequency domain as wideband excitation 57. This may allow multiple PIM sources within the frequency selective device to be located. The modulated signal may be conveniently modulated with, for example, a spread spectrum direct sequence pseudo-random code, or an OFDM or SC-FDMA modulation. As shown in FIG. 8, the frequency selective device under test 2 has respective frequency selective transfer functions preceding and following each of two PIM sources at different locations, and test apparatus for receiving and measuring the generated PIM as a time waveform, as shown in FIG. 8 as the Capture PIM Waveform functional block 15.

Figure 9:
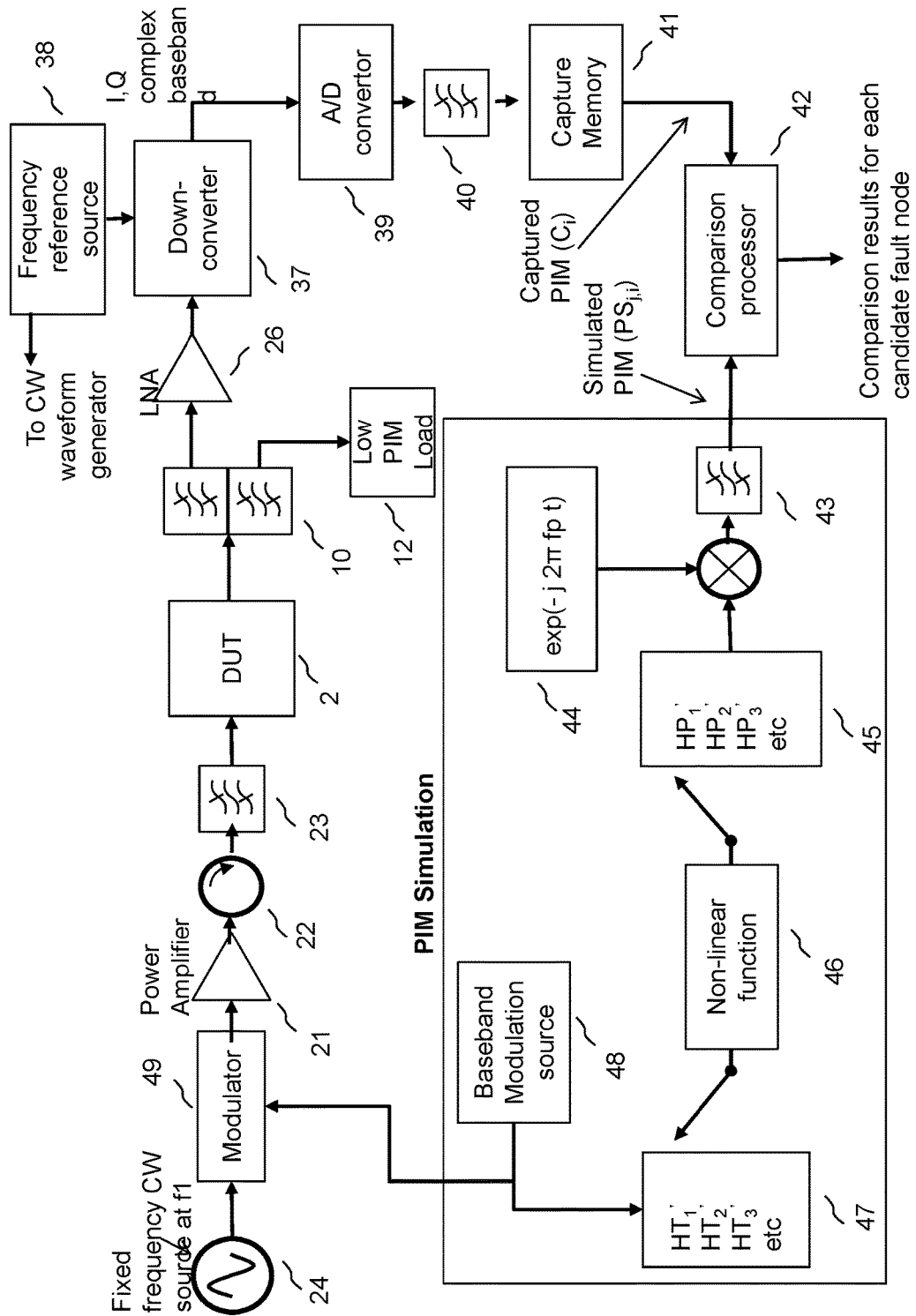
FIG. 9 is a schematic diagram showing test apparatus for generating a measured time domain PIM response signature and comparing this with example PIM signatures by correlation in an embodiment of the invention.

The embodiment of FIG. 8 is shown in more detail in FIG. 9.

As shown in FIG. 9, the excitation waveform is generated by a baseband modulation source 48, which may generate, for example, a SC-FDMA waveform, which typically has good peak-to-mean amplitude properties. The excitation waveform may or may not include a CW carrier. In the example of FIG. 9, the excitation waveform consists of one modulated signal. The modulation source 48 is used to modulate a fixed frequency signal from a fixed frequency source 24, using a modulator 49. The signal then passes through a power amplifier 21, circulator 22 and filter 23 and is applied to the frequency selective device under test 2. At the output of the device under test 2, the excitation signal is passed by duplexer 10 to a load 12, in other words a termination of the correct impedance and power rating to absorb the high power excitation signals. The load may be specified such that it will not itself generate significant levels of PIM, and the same, may be true for the other radio frequency parts of the test equipment.

Any PIM generated in the device under test 2 at frequencies of interest for the test is directed by the duplexer 10 via low noise amplifier 26 to downconverter 37. The downconverter is locked to the same reference frequency source 38 as is the baseband modulation source 48 and the fixed frequency CW source 24. The downconverter downconverts the received PIM, which is converted to the digital domain in analogue to digital converters 39 and filtered 40 to remove any spurious mixer products. The complex baseband signal, which is the measured PIM response signature, is captured and stored in memory 41 as a time domain waveform. This captured measured PIM response signature is fed to the comparison processor 42, which compares it with each of several example PIM response signatures generated by the PIM simulation functional block, which is implemented by standard digital signal processing implementation methods, such as a gate array, DSP chip, or software.

In the example shown in FIG. 9, the PIM simulation block generates simulated PIM response signatures from the same excitation signal used as the basis of the transmit signal, represented at baseband, as generated by the baseband modulation source 48. The baseband excitation signal is passed through a selected pre-PIM transfer function 47, applied to a non-linear function 46 to generate simulated PIM, and the generated PIM is then passed through a selected post-PIM transfer function 45, mixed with a local oscillator signal 44 and filtered 43, to be applied to the comparison processor 42. The comparison processor 42 may be a correlation processor.

The non-linear function 46 may be, for example, of the form $|A|^{n-1}A$, where A is the baseband signal comprising filtered baseband excitation signals and n is an exponent value chosen to match the PIM product of interest. A typical value of n is 3, for third order PIM products generated at frequencies 2f1−f2 or 2f2−f1. The nonlinear PIM simulation function may more generally be a function of the form $|A|^{p-m}A^m$, where A is a time sample of the filtered baseband modulation streams and p is an exponent value of a PIM product and m is a sum of frequency coefficients of the PIM product. So, taking the example of a PIM product as an intermodulation product between signals at carrier frequencies $f_1$ and $f_2$ at a frequency of $2f_1-f_2$, the factor m would be 1, because the frequency coefficients of $f_1$ and $f_2$ are 2 and −1 respectively. In this case, for an exponent value of 3, the non-linear function would be $|A|^2A$. A non-linear PIM simulation function may be a combination of non-linear functions of different exponent value. The frequency components represented by $f_1$ and $f_2$ may be signal components of a modulated signal at a single carrier frequency, rather than necessarily two different carrier frequencies. Applying a PIM simulation function by passing a composite baseband representation of more than one data stream through a non-linear operation, is described, for example, in the published patent application GB2517298.

The comparison processor 42, in the embodiment in which it is a correlation processor, correlates, that is to say cross-correlates, the measured PIM response signature with each of several simulated PIM response signatures, each of the simulated PIM response signatures being simulated with different combination of pre-PIM transfer functions and post-PIM transfer functions to simulate PIM generated at different locations within the frequency selective device. The simulated PIM response signature giving the best correlation is chosen, and the location used as the basis of the simulation of the chosen simulated PIM response signature is used as the estimate of the location of the PIM source. This may be the precise location of a faulty node generating PIM, or an approximate indication of a part of the frequency selective device. The "best" correlation may be chosen as the correlation with the highest peak. Alternatively, the amplitude of the correlation may be given more weighting towards the centre of the response, that is to say with zero time offset.

So, in an embodiment of the invention, the plurality of example PIM response signatures are simulated results determined from simulations of frequency selective devices having respective PIM sources located at known locations within the respective frequency selective devices. This allows simulated results for a large number of hypothetical locations of PIM sources to be generated.

As an alternative to the PIM simulation process shown in FIG. 9, in an embodiment of the invention, the example PIM response signatures may be measured results determined from frequency selective devices having respective PIM sources located at known locations within the devices. This allows accurate identification of known fault conditions of the frequency selective device.

Figure 10:
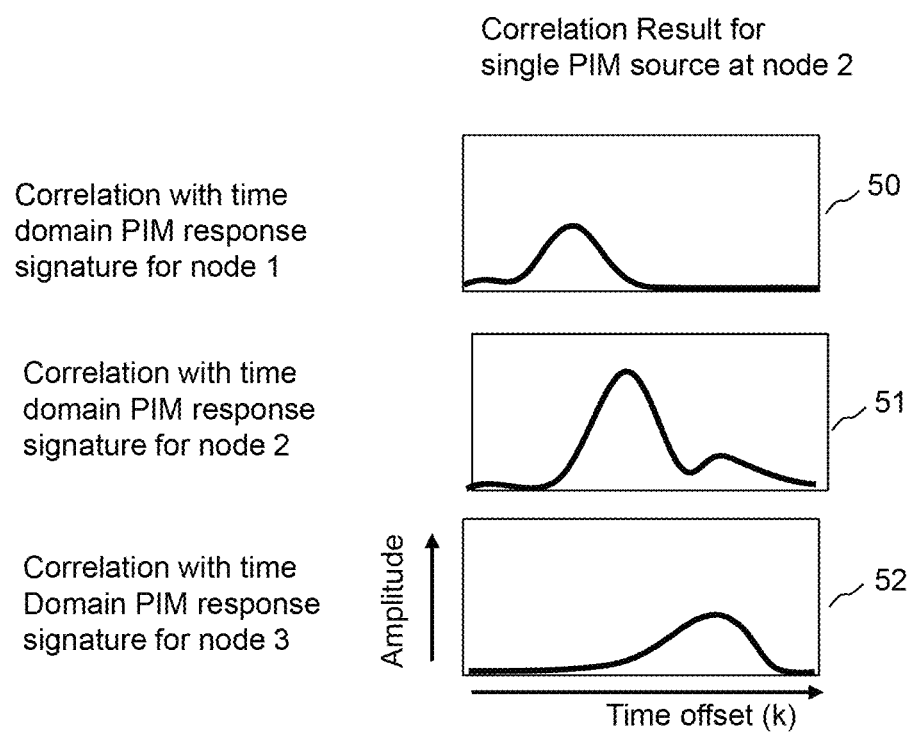
FIG. 10 shows a schematic representation of correlation results for example time domain PIM responses, for a single PIM source, in an embodiment of the invention.

FIG. 10 shows a schematic representation of correlation results 50, 51, 52 for example time domain PIM responses for a single PIM source at nodes 1, 2 and 3 respectively, in an embodiment of the invention. It can be seen that the correlation for node 2 has the highest correlation peak, and also has the highest peak when the correlation result is weighted towards the zero time difference point. Node 2 is thus chosen as the most likely location for the PIM source.

Figure 11:
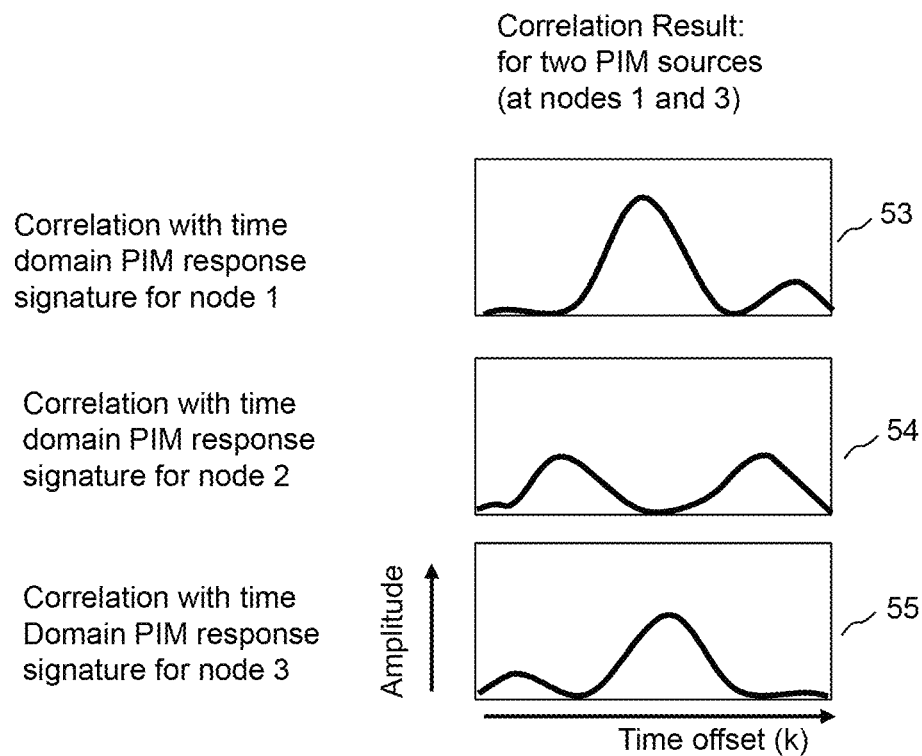
FIG. 11 shows a schematic representation of correlation results for example time domain PIM responses, for two PIM sources, in an embodiment of the invention.

FIG. 11 shows a schematic representation of correlation results 53, 54, 55 for example time domain PIM responses, for two PIM sources, one at node 1 and one at node 3, in an embodiment of the invention. It can be seen that the correlation for node 1 and the correlation for node 3, taken either as an unweighted or centre weighted correlation as already described, would be selected as the locations for the sources of PIM on the basis of the highest correlation peak.

As an alternative to the correlation approach, the comparison processor 42 may implement a so-called orthogonal subspace projection for waveform comparison. This alternative method using linear algebra will now be described.

The Orthogonal Subspace Projection (OSP) technique is one possible approach for comparing the measured PIM output of the filter under test (in response to a known excitation waveform) with the pre-computed simulated PIM responses (to the same excitation waveform) in order to decide the most likely PIM location or locations. The OSP method assumes that the measured waveform may be represented as a weighted sum of the respective simulated responses corresponding to the actual PIM locations. The OSP method allows identification of the minimum set of simulated response waveforms which can be used to 'construct' the measured waveform. In linear algebra terms, this minimum set of response waveforms span the subspace of the entire signal space within which the actual measured waveform lies in its entirety (i.e. the measured waveform has no component orthogonal to this subspace). To locate an undesirable PIM source in a cavity filter, as has already been described, a measured captured PIM waveform, that is to say a measured PIM response signature, for a pre-defined high-power transmitted driving stimulus signal may be compared with pre-computed PIM candidate waveforms, that is to say example PIM response signatures, obtained by simulating a filter for different locations of the PIM source. The process of comparing works not only for single PIM sources, but also for the case of multiple filter PIM sources at different PIM source locations.

It may be assumed that a PIM source, if it exists, is located at one or more of only up to n possible hypothesized locations, all of which are separately tested within the simulation model, so that there are n waveforms, that is to say n example PIM response signatures in the time domain, produced by the simulation model. In an example, n=5. It is likely that, in a real filter, PIM from one PIM source would not be strong enough to cause or influence further PIM from a separate PIM source elsewhere in the filter. Accordingly, the n PIM sources can be simulated separately and independently. Both simulated and measured waveforms may be normalized to the same mean power before post-processing.

If the waveforms each contain 'r' complex IQ samples, then each can be represented as an r-element vector in an r-dimensional complex space. Taking the example of n=5, it may be assumed that all 5 vectors representing the simulated waveforms ($PS_1$-$PS_5$) are linearly independent, and so between them they span a 5 dimensional (5-D) subspace of the full r-D vector space. A single waveform vector can be considered to span a 1-D subspace, a pair of vectors will span a 2-D subspace and so on (by 'span' we mean that any vector lying entirely in that subspace can be represented as a weighted sum of them).

If there is only a single PIM source, then the measured, captured, waveform vector will lie entirely in the subspace spanned by the corresponding simulated waveform vector for that PIM location, that is to say it will equal that simulated vector, multiplied by a single complex scalar. If there are multiple PIM sources, each at different locations, then the measured waveform vector will lie entirely in the subspace spanned by the simulated waveform vectors corresponding to those same locations. The minimum set of simulated waveform vectors is identified that are needed in order to define a subspace in which the measured waveform vector lies entirely, that is to say the measured waveform has no component orthogonal to this subspace.

For each set of simulated waveform vectors which span a subspace, both a projection vector onto that subspace and a projection vector onto the subspace is defined which is orthogonal to that subspace.

If the measured vector is pre-multiplied by the projector onto the orthogonal subspace, and a zero-valued vector result is obtained, specifically a zero value for the square root of sum squared magnitudes of elements of the result, known as a "L2 norm", then this indicates that the measured vector lies entirely in the simulated waveform subspace. This is because the measured vector has no component orthogonal to that subspace. As a result, the measured waveform can be described as a linear complex-weighted sum of the simulated waveform vectors.

If Q is a matrix with each column equal to a simulated waveform vector, then the projection matrix onto the subspace spanned by the columns of Q is given by $P = Q^*(Q^T Q^*)^{-1} Q^T$, where $\cdot^T$ denotes transposition (without conjugation), $\cdot^*$ denotes conjugation (without transposition), and $\cdot^{-1}$ denotes matrix inverse.

The projection matrix, N, onto the subspace which is orthogonal to the column vectors of Q is given by $N = (I-P)$, where I is the identity matrix.

The comparison method comprises constructing the versions of the matrix N from different matrices Q using any subset of the n simulated waveforms, and use the N matrices in turn to pre-multiply the measured waveform vector, and record the 'L2-norm' of the resultant vector, that is to say to record the square root of sum squared magnitudes of elements of the result. The version of N which corresponds to Q with the fewest columns which gives a zero resulting L2-norm is the one which defines the minimum set of simulated waveforms which span a space in which the measured waveform lies entirely, and hence defines the detected filter PIM locations.

In measurements which may have small filter imperfections and noise, a low but non-zero value of threshold may be used for L2-norm, below which the L2-norm is deemed to be zero.

The best detection reliability will be achieved if the n simulated waveforms are maximally 'different' one from the other, so that the angles between their vectors in the signal space are as large as possible. This can be aided by configuring the excitation waveform to energize portions of the filter transfer function which differ the most, for example at band edges, between pairs of filter nodes.

As an alternative implementation of the comparison processor 42, an alternative method using linear algebra may be performed. In this alternative method, canceller coefficients are derived with the aim of weighting each of the respective example PIM response signatures in amplitude and phase to cancel the measured PIM response signature. If the weight for one or more respective example PIM response signatures has a magnitude over a threshold value it is assumed that PIM is present in the filter in the location corresponding to those example PIM response signatures. Canceller coefficients may be generated by well-known methods including weight perturbation.

As a further alternative method of comparing the example PIM response signatures with the measured PIM response signature, a machine learning approach may be used. Machine Learning (ML) relates to signal classification by extracting features from a waveform using signal processing techniques, and then, using training data for which the classification is known, teaching a computer algorithm to 'recognize' certain patterns of those features and classify the waveform on that basis. The classification in this particular application might be the location of the PIM source in the filter which generated the PIM waveform. One way to generate features from the PIM output waveform in response to a known excitation waveform, assuming a single filter PIM source location of the device under test is to cross-correlate the measured PIM output of the filter under test with the pre-computed simulated PIM responses to the same excitation waveform. A pattern of cross-correlation amplitudes can be obtained which is characteristic of that particular filter PIM location. By comparing that pattern with pre-computed patterns for the same filter which have been used to train an ML algorithm, the ML algorithm may be used to automatically classify the location of the measured PIM. By providing the ML algorithm with additional training data, from additional simulations of the filter taking account of response variations due to manufacturing tolerances, an ML approach may be created which is able to correctly classify PIM source location not only for a filter with a perfect response, but also even for filters which have response variations due to imperfect manufacturing tolerances.

Cross-correlation can be used to define a coordinate in multi-dimensional real space for which we can compare measured PIM with simulated PIM. The dimensionality of the space may be expanded by carrying out filter tolerancing. Further dimensionality expansion may be achieved by simulating additional different excitation waveforms. Machine Learning (ML) approaches such as SVM or Neural Networks may be used to classify the PIM location based upon the simulated and measured PIM cross-correlations. Filter PIM location may be treated as a classification problem. A choice may be made between TIM location is filter node 1', 'PIM location is filter node 2', . . . etc. The data upon which the classification is based is the normalized recorded PIM response signature when the filter is excited by the high-power excitation signal.

The process of feature extraction is to cross-correlate (xcorr) the measured PIM response signature with the simulated PIM waveforms, that is to say the example PIM response signatures, for the same excitation signal, for each assumption about possible PIM location. The amplitude of the cross-correlation may be used and the phase may be discarded.

Taking the example of 5 possible PIM locations simulations, this results in 5 real cross-correlation values for the measured PIM response signature. Thus a single coordinate is obtained in 5D real space corresponding to the measured PIM. A simple classifier can choose the predicted PIM location as being the one which minimises the distance between the 5D coordinate for the measured PIM and the chosen one of the five separate 5D coordinates for each simulated PIM location.

Additional training data may be generated by carry out a tolerancing exercise over multiple random filter realizations, for example an additional 10, to simulate likely component tolerances, for example due to tuning tolerances or due to mechanical inaccuracies in the filter manufacture. This may expand the coordinate space to 55D, so that 55 cross-correlation may be performed against 55 simulated PIM waveforms, but there are still only 5 data points to compare against for the classification. That is to say each hypothesis for PIM filter location yields a single coordinate in 55D real space. Alternatively, cross-correlations may be performed only for the new simulated PIM responses against the original 5 PIM waveforms for the perfect filter. This provides a cluster of 11 data points in 5D space for each PIM location hypothesis. An ML classification technique such as SVM or Neural Networks may be used to find optimal hyperplanes to separate the 5 clusters. The cross-correlation of the measured PIM response against the 5 PIM waveforms may be calculated for the perfect filter to find which cluster it best maps to, and hence which is the most likely filter PIM location. Multiple different driving waveforms may be used to expand the dimensionality of the space over which the matching is performed. For each new waveform tested, an additional set of 5 expected cross-correlation values for each simulated filter realization is obtained. The most benefit may be derived for the cases in which the new driving waveforms differ significantly from the initial one.

Alternatively to using the amplitude of cross-correlations as the feature against which the waveform is classified, different and/or additional features could be used, for example the slope of the power spectral density, and the positions of the peaks and nulls in the power spectral density.

Figure 12:
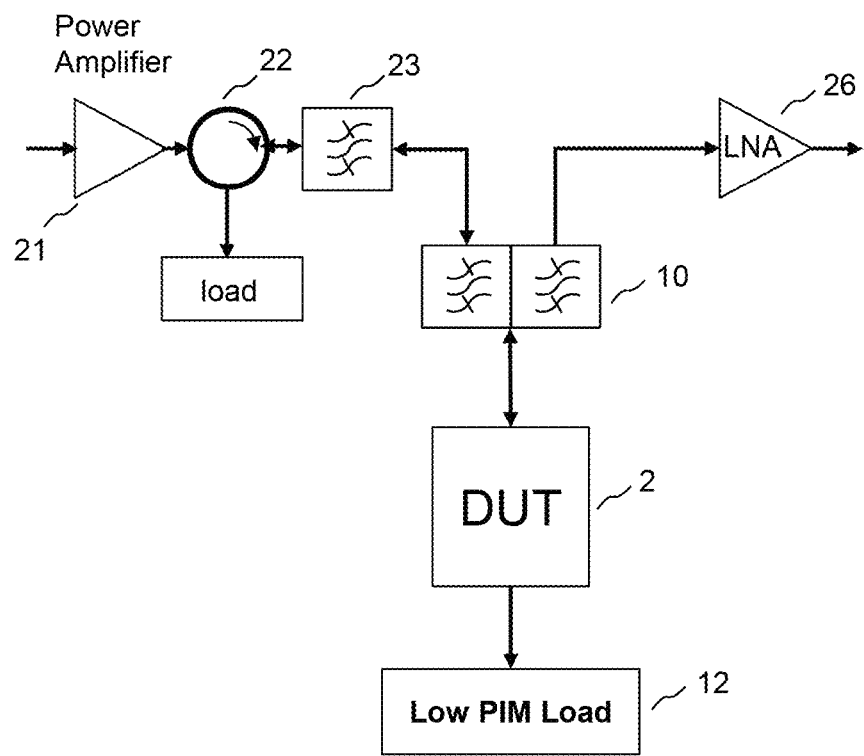
FIG. 12 is a schematic diagram showing connection of the test apparatus to measure PIM reflected from the frequency selective device in an embodiment of the invention.

FIG. 12 is a schematic diagram showing connection of the test apparatus to measure PIM reflected from the frequency selective device 2 in an embodiment of the invention. It can be seen that measured PIM is received on the same port as is used to apply the excitation waveform, the signals being separated by the duplexer 10.

Figure 13:
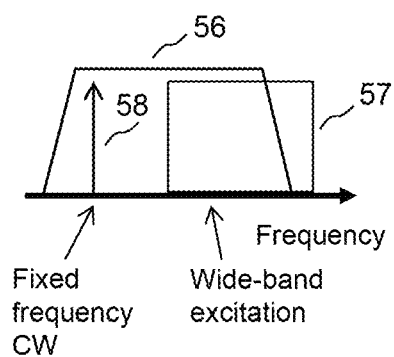
FIG. 13 shows a schematic representation of an excitation waveform comprising a wideband modulated signal and a fixed frequency continuous wave (CW) signal shown in the frequency domain in an embodiment of the invention.

FIG. 13 shows a schematic representation of an excitation waveform comprising a wideband modulated signal 57 and a fixed frequency continuous wave (CW) signal 58 shown in the frequency domain in an embodiment of the invention. The passband 56 of the frequency selective device is shown. The modulated signal may occupy more than 10% of a passband of the frequency selective device.

Figure 14:
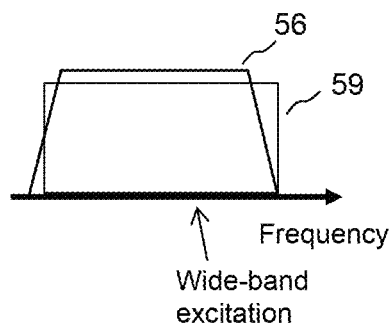
FIG. 14 shows a schematic representation of an excitation waveform comprising a wideband modulated signal occupying the whole passband of the frequency selective device and extending into the frequency cut-off regions in an embodiment of the invention.

FIG. 14 shows a schematic representation of an excitation waveform comprising a wideband modulated signal 59 occupying substantially the whole passband 56 of the frequency selective device and extending into the frequency cut-off regions in an embodiment of the invention.

Figure 15:
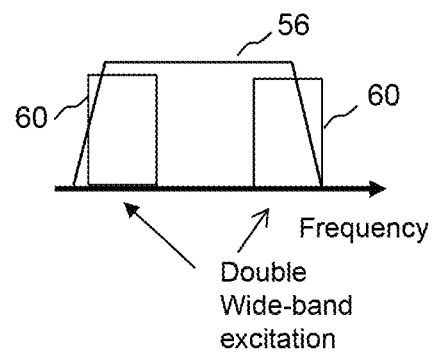
FIG. 15 shows a schematic representation of an excitation waveform comprising a wideband modulated signal occupying the upper and lower edges of the passband of the frequency selective device and extending into the frequency cut-off regions in an embodiment of the invention.

FIG. 15 shows a schematic representation of an excitation waveform comprising a wideband modulated signal 60 occupying the upper and lower edges of the passband of the frequency selective device and extending into the frequency cut-off regions in an embodiment of the invention. The first modulated signal includes frequencies in a lower frequency cut-off region of a filter characteristic of the frequency selective device, wherein the excitation waveform comprises a second modulated signal including frequencies in a upper frequency cut-off region of a filter characteristic of the frequency selective device. The excitation waveform comprises an unoccupied frequency band between the first and second modulated signals. This may emphasize differences between PIM response signatures at different locations, because differences in the response may be greater at the edges of the pass band of the frequency selective device.

Figure 16:
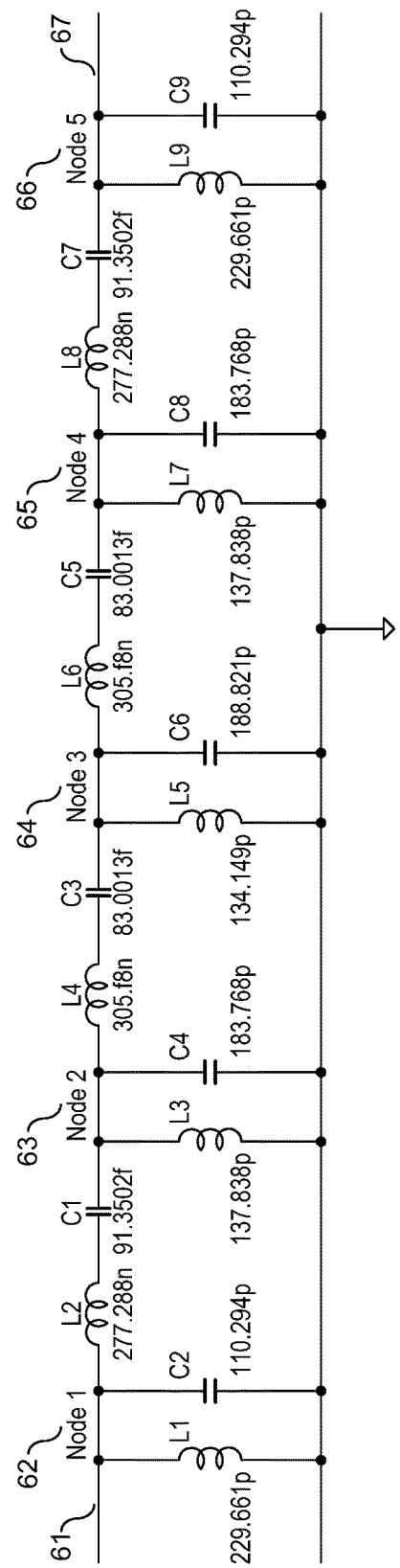
FIG. 16 shows an example of a frequency selective device in the form of a lumped element band pass filter.

FIG. 16 shows an example of a frequency selective device in the form of a lumped element band pass filter. The filter has two ports, port 1 61 and port 2 67. Port 1 can be considered as the input port and port 2 as the output port, but in fact the device is reciprocal and so signals may be passed in either direction. The device shown is a lumped element implementation, that is to say that individual capacitor and inductor components are used, as opposed to a cavity design which may have distributed capacitance and inductance, but which may have a similar response. Nodes within the filter are shown; these are locations within the frequency selective device such as, for example, metallic junctions between components. In this example, five nodes are shown: node 1 62, node 2 63, node 3 64, node 4 65 and node 5 66. Other nodes could be sources of PIM, for example the grounding connections of the capacitors and inductors shown, and locations within or between the cavities of a cavity filter.

The example filter of FIG. 16 is a simple 9 pole 0.2 dB ripple Chebyshev lumped element filter, centered on 1 GHz and with a bandwidth of 40 MHz.

For a coupled resonator cavity filter the intermediate series elements would be transformed into shunt elements.

The filter is symmetric, hence if there is a PIM fault at node 4 the Tx exciting function will be the "node 4" response and the PIM filtering response will be the "node 2" response.

Figure 17:
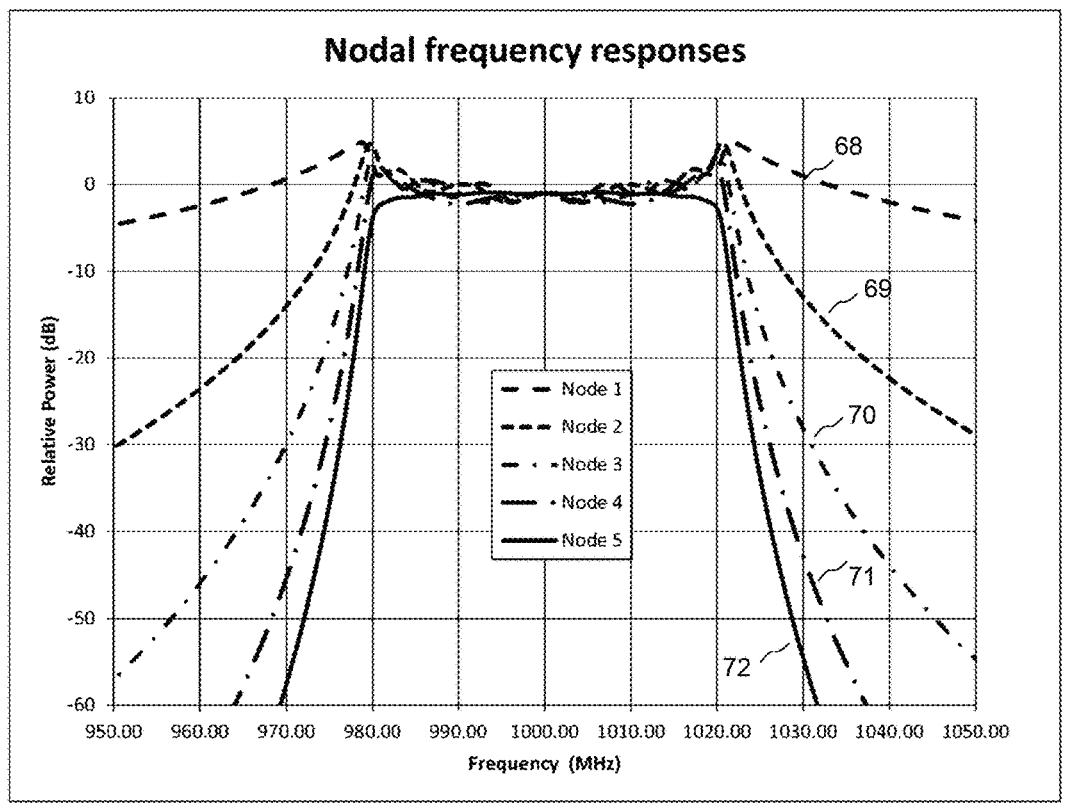
FIG. 17 shows frequency responses from the input port to each node of the filter of FIG. 16.

FIG. 17 shows frequency responses from the input port to each node of the filter of FIG. 16; the responses are shown to node 1 68, to node 2 69, to node 3 70, to node 4 71 and to node 5 72. This is a representation of a voltage at each node as a function of frequency, given a constant amplitude swept frequency excitation at the input port 61. The vertical scale represents the voltage v on a logarithmic scale, as 20 log v. This therefore represents examples of the transfer function $HT_j(f)$ as shown in FIG. 3.

Figure 18:
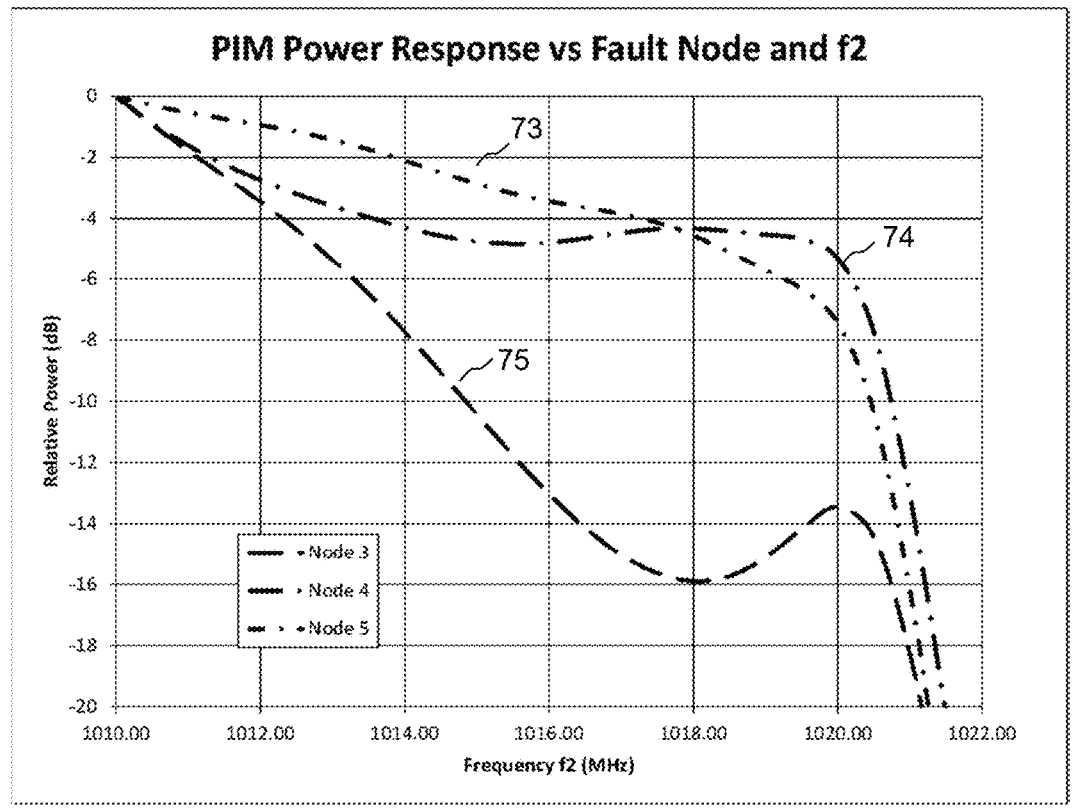
FIG. 18 shows PIM power at the output port of the filter of FIG. 16 for an excitation waveform comprising a fixed frequency signal and a swept frequency signal, for the case of PIM sources at node 3, 4 or 5.

FIG. 18 shows PIM power at the output port of the filter of FIG. 16 for an excitation waveform comprising a fixed frequency signal and a swept frequency signal, for the case of PIM sources at node 3 75, node 4 74 or node 5 73. Each of these response is an example of a PIM response signature. Comparing a measured PIM response signature to each of these could be used to identify at which node the PIM node is located. In this example, f1 was a CW fixed at 985 MHz and f2 swept between 1010 MHz and 1022 MHz. The responses have all been normalised to 0 dB at f2=1010 MHz.

Figure 19:
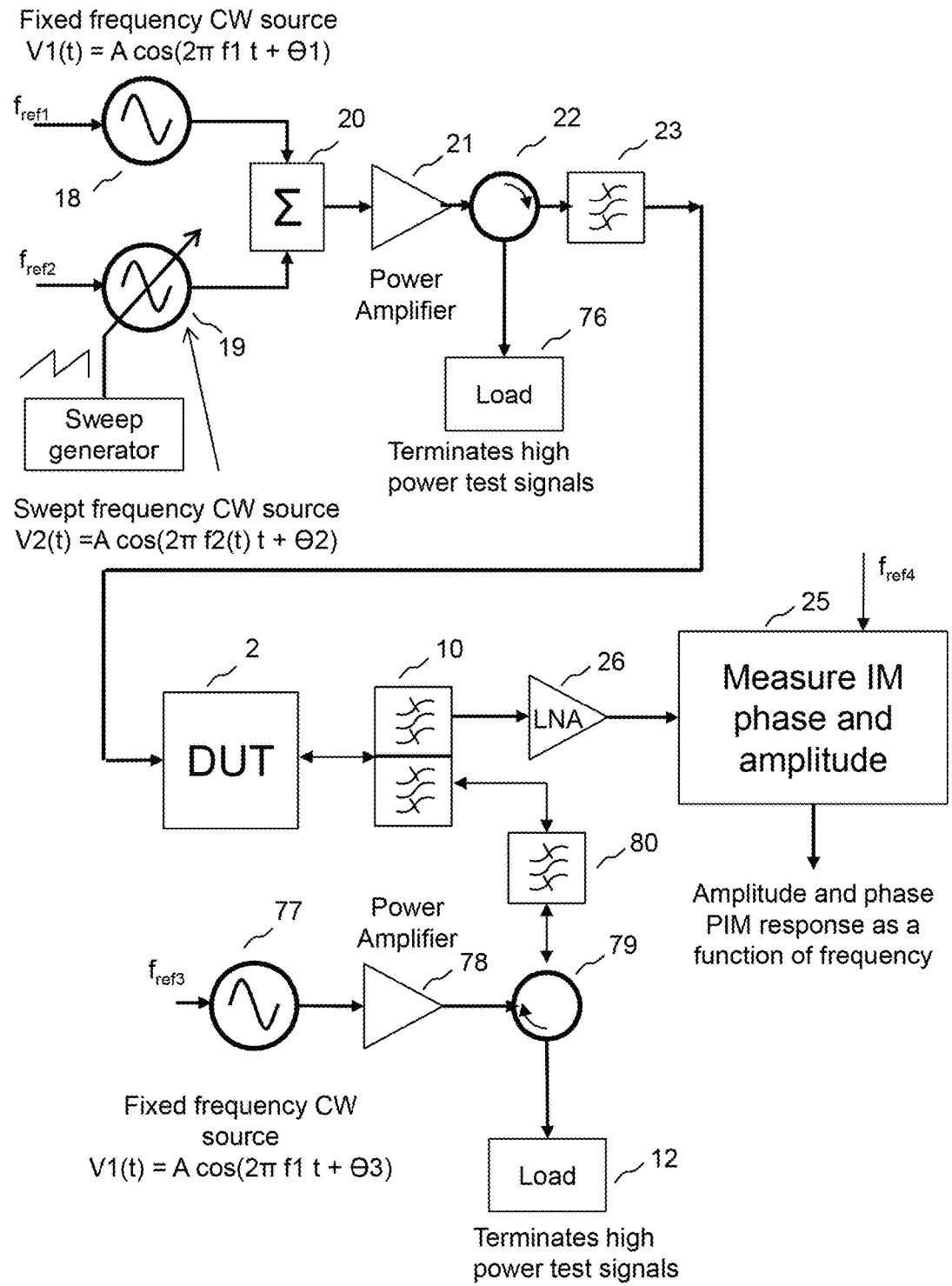
FIG. 19 is a schematic diagram showing excitation of the frequency selective device using excitation waveforms applied to both the input and the output ports simultaneously.

FIG. 19 is a schematic diagram showing excitation of the frequency selective device using excitation waveforms applied to both the input and the output ports simultaneously. In order to isolate the sources of PIM within a filter, it may be advantageous to deliberately excite certain nodes in preference to others. This may be achieved in a transmission arrangement by one or both of the excitation waveforms being applied to both the input and the output ports of the DUT simultaneously, for example with a phase offset. FIG. 19 is a modified version of the arrangement which has already been described in connection with FIGS. 4 and 5. In the arrangement of FIG. 19, an additional signal source is shown, comprising, in this example a fixed signal source 77.

A swept or modulated signal source could also be used. The signal sources 18, 19, 77 may be provided with respective frequency references $f_{ref1}$, $f_{ref2}$, $f_{ref3}$ which are derived from the same reference signal generator, which is also used to generate a reference frequency to the receiver measurement module 25. This allows the receiver and transmitter to be locked to the same reference, so that results are repeatable. The signal from the additional signal source is amplified by a power amplifier 78, and directed by the circulator 79 via the filter 80 and the duplexer 10 to the device under test 2. Excitation signals from the additional signal source emerging from the device under test 2 are directed by circulator 22 to load 76 for dissipation as heat. Also, the excitations from the signal sources 18, 19 which are applied to the opposite port of the device under test are directed by the duplexer 10 and circulator 79 to the load 12 for dissipation. Any PIM in a band of interest produced by the excitation signals applied to either or both ports of the device under test will be directed by the duplexer 10 via low noise amplifier 26 to the measurement circuit 25 to derive a measured PIM response signature for comparison with example PIM response signatures, based on measurements of simulations of a similar device under test stimulated with excitation signals applied to both ports as per the arrangement of FIG. 19. The excitation waveform may be seen as the composite of the excitation signals applied to the two ports of the frequency selective device.

A similar approach may be adopted for the arrangement of FIG. 9, in which the arrangement of FIG. 9 is modified so that modulated waveforms are applied to both ports of the device under test, by provision of a further signal generator connected to diplexer 10 via a circulator, and a load is provided to the circulator 22 to terminate the additional high power modulated waveform. The PIM would be received via duplexer 10 and low noise amplifier 26 as shown in FIG. 9. The PIM simulation function would be modified to model the arrangement in which the frequency elective device is driven from both ends. So, the baseband modulation source may be applied to two sets of transfer functions, different permutations of which may be selected to be applied to the non-linear function. For each PIM source, this simulates the transfer functions from the first port of the frequency selective device to the PIM source, and from the second port of the frequency selective device to the respective PIM source. The non-linear function then acts on the composite of the excitation signals received from the two ports of the frequency selective device under test 2.

Figure 20:
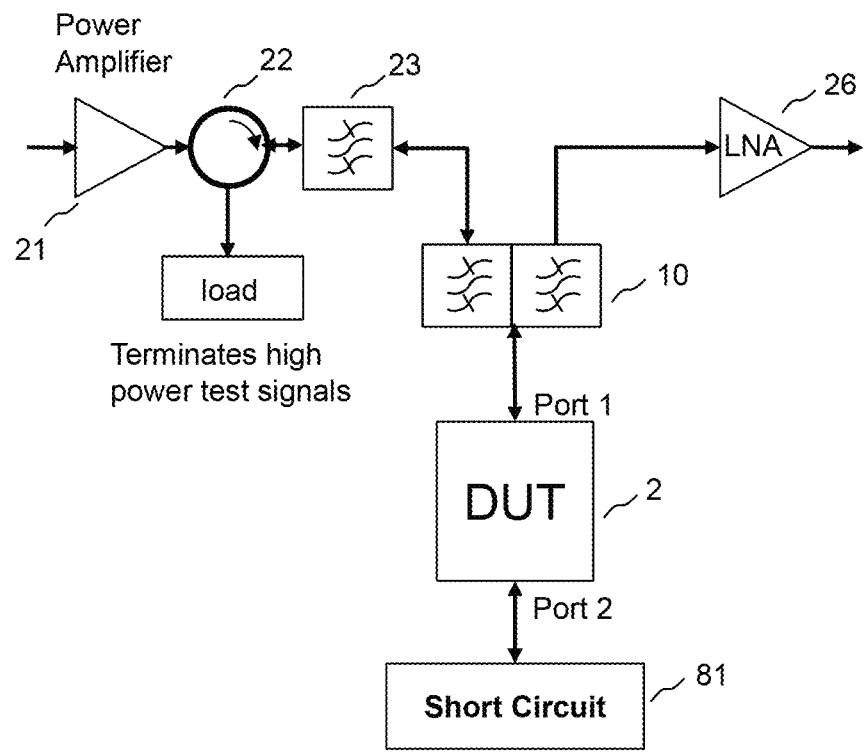
FIG. 20 shows measurement of the PIM response of the frequency selective device using a short circuit at the output port of the frequency selective device.

Alternatively, in a reflective arrangement, application of the excitation waveform to both the input and the output port may in effect be achieved by terminating the one port of the device under test (DUT) with a reflective termination such as a short circuit, and hence using the reflected excitation waveform in combination with the forward travelling excitation. An open circuit termination could be used as an alternative. An example of a test set up for a reflective arrangement is shown in FIG. 20. FIG. 20 shows measurement of the PIM response of the frequency selective device using a short circuit at the output port of the frequency selective device. The short-circuit reflection mode may enhance the frequency response discrimination between nodes. FIG. 20 has the components of FIG. 12, but with the low PIM load 12 of FIG. 12 replaced with the short circuit of FIG. 20. Typically the PIM generated nearer to an antenna port of a filter can cause the greatest concern and for this reason it may be advantageous to apply the reflective termination to an alternative port. For example the port that would normally be connected to a power amplifier.

Figure 21:
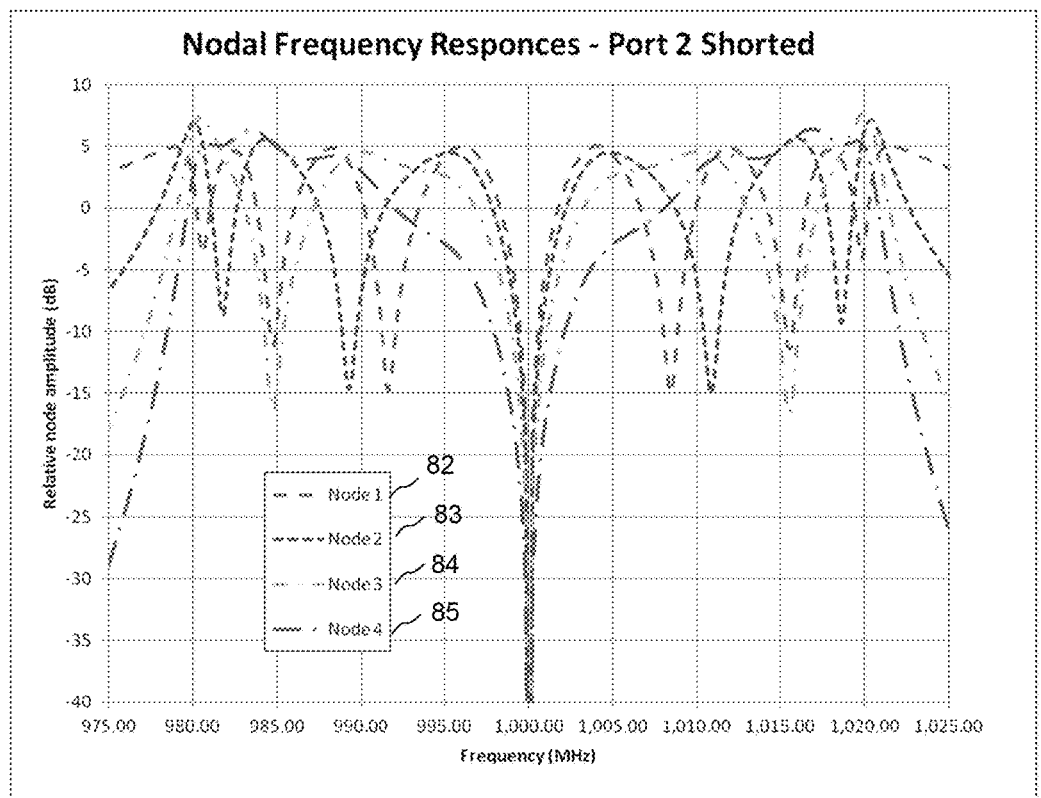
FIG. 21 shows nodal frequency responses of an example filter with the output port shorted.

FIG. 21 shows nodal frequency responses of an example filter with the output port shorted. The phase offset between the signals travelling in each direction will dictate whether a voltage null or a voltage peak is seen at a given node. FIG. 21 shows frequency responses from the input port to each node of the filter of FIG. 16, including the effects of reflection back to the node from the output port, for the case where port 2 is shorted. The responses are shown to node 1 82, to node 2 83, to node 3 84, and to node 4 85. This is a representation of a voltage at each node as a function of frequency, given a constant amplitude swept frequency excitation at the input port 61. The vertical scale represents the voltage v on a logarithmic scale, as 20 log v.

In the reflective arrangement, the frequency response of the PIM may show a very distinct pattern of peaks and nulls. The simplest excitation signal arrangement would be a CW and a swept CW. The swept CW may be stepped. A wideband signal and a swept, potentially stepped, CW or two wideband signals could be used as an alternative, or a single wideband signal. The modulated excitation waveform may be pre-distorted in such a way as to preferentially excite one node over another in order to improve discrimination in the detection.

Figure 22:
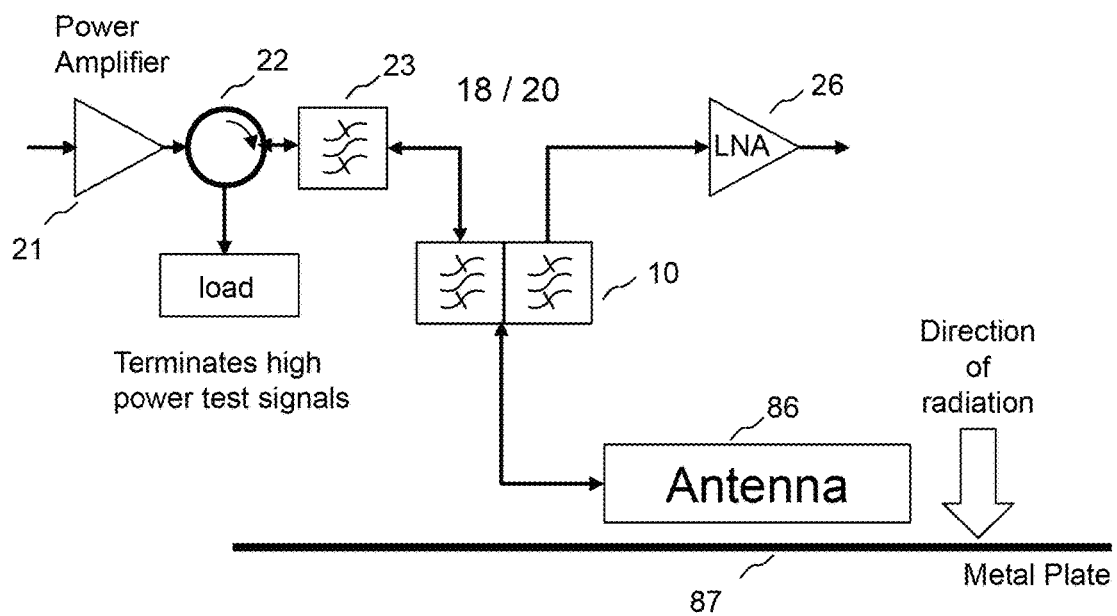
FIG. 22 shows testing of an antenna using a reflected signal path.

FIG. 22 shows testing of an antenna using a reflected signal path. The reflective approach may be particularly helpful in antenna PIM fault finding where there may be little electrical delay between antenna components but there may be a distinct phase difference. The mismatch at the output of the antenna could be ensured by either placing a metal reflective plate immediately in front of the radome, as shown in FIG. 22, or using excitation signals that are outside the intended operational frequency band of the antenna and are thus substantially reflected back from the elements. The remote electrical tilt (RET) mechanism of the antenna could be used to introduce additional phase length to subsets of elements. This would give the reflected PIM a different frequency response and hence provide additional data points for greater certainty in the result.

So, as has been discussed, finding the location of a PIM fault in selective frequency devices such as filters can be problematic. Embodiments of the invention locate the PIM fault from response analysis of the resultant PIM when the device is excited over a range of frequencies.

PIM spectra relating to specific PIM locations may be used to locate PIM faults by comparing the measured PIM response to a set of example responses. The example responses may be pre-determined from the relevant device transfer functions or obtained by measurement of sample devices with known faults.

As shown in FIG. 3, The PIM source will typically exist at a node in the filter which may, for example, correspond to a resonator position.

The measured PIM response, PIM(f) will experience both the impact of $HT_j(f)$ and $HP_j(f)$ giving a unique PIM response signature for each node in the DUT.

Given knowledge of the filter design, $HT_j(f)$ and $HP_j(f)$ can be determined for each node "j" in the filter.

A simulation to give the expected $PIM_j(f)$ response for each node may be made and compared with the measured result, the best "match" indicating the estimated PIM location. Alternatively, or additionally, the response may be compared to a measurement database of faulty filters each with known PIM locations. The best match may be used to estimate the fault location. The frequency response matching process may be more challenging to apply when there is more than one PIM source as the composite response would need to be compared to a database of composite response results for all combinations of possible faults.

As shown in FIG. 8, to help resolve multiple PIM sources the second CW source may be replaced with a wideband signal having good autocorrelation properties (when it is used to generate PIM) and the resultant PIM waveform captured. The captured PIM waveform may then be correlated with a set of simulated PIM waveforms, each corresponding to a specific PIM source location within the filter. By comparing the measured correlation response with the simulated responses an indication will be given of the likely PIM source locations within the filter. The correlation response may consist of more than one peak. This delay aspect may be combined with the individual response shape to help refine the PIM location points.

Measuring the PIM(f) near the edge of the filter pass band (or passbands in the case of a duplexer) may assist in providing a distinct signature for the PIM source location. With a duplexer this could involve arranging the Tx frequencies such that one Tx sweeps near the passband edge at the same time as the resultant PIM sweeps near the Rx passband edge. f1 may be swept near the lower edge of a filter at the same time as f2 is swept over the upper filter edge might help emphasize the signature differences between potential PIM fault locations.

If f1 and f2 are swept together in manner that keeps the IM product at a constant frequency it may be possible to remove the variability of HP(f) from the measurement, e.g. let f1(t)=2 f2(t)−fpim, where fpim is the frequency at which the PIM is generated and measured, this corresponds to the case where the PIM is $3^{rd}$ order and with a frequency above f1 and f2 This may provide an additional aspect of the measurement which may be beneficial to diagnosis of the PIM fault location. Both amplitude and phase of $PIM_j(f)$ may be used in the analysis.

Alternative DUT port excitation may help to refine location estimate, as follows. As shown in FIG. 12, for reflection mode PIM, a further measurement dimension may be obtained by exciting the filter from the antenna port direction and measuring the reflected PIM. Measurement from antenna port and Rx ports may further refine the PIM location estimates for the case of in Rx band PIM scenarios. The transfer function of any measurement filters are typically included in the modelling.

Returning to FIG. 4 and FIG. 5, it can be seen that the DUT may be excited with 2 high power CW sources. The phase and amplitude of a specific intermodulation product may be measured as one CW source is swept in frequency. The measurement and the CW sources are typically all derived from a common reference source to facilitate phase measurements.

As shown in FIG. 6, the PIM signal is taken from the LNA where in this example the third order upper PIM product will appear at a frequency of 2 f2−f1. This is down-converted to I,Q complex baseband using (for example) a local oscillator at f1 giving rise to a baseband frequency of 2 (f2(t)−f1), so sweeping over twice the frequency range of the original excitation. By multiplying the complex baseband signal by a counter rotating unit vector as shown the frequency sweep is removed. This results in a complex vector whose amplitude and phase vary over time in a manner which may be related to the PIM signature of the DUT over frequency. Following vector counter-rotation the resulting signal may be filtered to remove noise but with a bandwidth sufficient to ensure that the desired PIM signature is not distorted.

There may be some phase offsets resulting from the phase offsets in the original CW excitation waveforms as well as phase and amplitude uncertainties resulting from other RF components and interconnect in the measurement path. If these uncertainties are small they may be neglected, however if they become significant they may be removed by calibration using a known reference non-linear element.

In addition to the phase and amplitude measurement with respect to frequency the group delay τ may also be derived as a function of frequency from the phase measurements, given that τ=−dφ/dω where ω=2πf.

As shown in FIG. 7, the measured amplitude, phase and group delay PIM signatures may be compared to a number of either pre-calculated or pre-measured signatures relating to a number of fault locations for the DUT as shown below for the case of amplitude signatures.

As shown in FIG. 9, the DUT may be excited with a high power wideband signal of bandwidth B. Other modulation signals may be used. As shown in FIG. 9, the PIM signal is taken from the LNA where in this example the third order upper PIM product will appear at a frequency of f1+fp where fp is the PIM offset frequency of interest. fp may be in the range B/2 to 3/2 B for a $3^{rd}$ order product.

This signal is down-converted to I,Q complex baseband using (for example) a local oscillator at f1+fp, giving rise to a signal of interest centered at zero frequency. The signal is then converted to a sampled digital waveform using A/D conversion and filtered to extract the desired PIM components of interest. A sequence of these samples may be stored in memory.

The block "Simulated PIM" derives the set of PIM waveforms that would be expected in the case of PIM faults at a set of candidate nodes in the DUT.

The baseband modulation signal is passed through a set of baseband transfer functions $HT_j'(f)$ which are baseband equivalents to the $HT_j(f)$ RF transfer functions. A baseband equivalent non-linearity is then applied which may, for this $3^{rd}$ order example, be of the form $Z |Z|^2$. The resulting non-linear products are then filtered in $HP_j'(f)$, the baseband equivalent of the RF transfer function $HT_j(f)$. The desired spectral components at the output are obtained by shifting the resulting waveform down in frequency by fp to align the desired spectral components with the measured data. This is then filtered to extract the PIM components of interest.

It may be convenient to pre-calculate a set of simulated PIM waveforms, each corresponding to a fault node in the DUT. The Correlation Processor computes the correlation between the captured measurement samples $CM_i$ and the set of simulated PIM samples $PS_{j,i}$ corresponding to each node "j" and for a time offset "k":

$$\text{Correlation}_{j,k} = \Sigma CM_i \text{conj}(S_{j,i+k})$$

This will give a set of correlation responses each with a different shape and delay corresponding to a specific fault node in the DUT. It may be convenient to normalize the pre-correlation measurement and simulated waveforms so as to remove the impact of PIM source strength from the correlation results. The PIM location may be estimated by comparing the measured correlation response with the expected correlation responses to find the best match.

The above embodiments are to be understood as illustrative examples of the invention. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A method of identifying a location, within a frequency selective device, of at least one PIM (passive intermodulation) source comprising:
    applying an excitation waveform to the frequency selective device;
    measuring a PIM response signature of the frequency selective device, the PIM response signature being a characteristic of PIM produced in response to the excitation waveform;
    comparing the measured PIM response signature with each of a plurality of example PIM response signatures, each of the plurality of example PIM response signatures corresponding to a characteristic of PIM expected for a respective location, within the frequency selective device, of a PIM source; and
    identifying the location, within a frequency selective device, of the at least one PIM source on the basis of said comparing.

2. The method of claim 1, wherein the excitation waveform comprises a first and a second signal, wherein at least one of the first and second signals is a swept frequency continuous wave signal.

3. The method of claim 2, wherein the measured PIM response signature and each of the plurality of example PIM response signatures represents a frequency domain characteristic.

4. The method of claim 3, wherein said comparing comprises
    generating a respective measure of a degree of matching between the measured PIM response signature and each of the plurality of example PIM response signatures.

5. The method of claim 4, wherein the measure of the degree
    of matching is a mean squares difference between frequency characteristics in amplitude and/or phase.

6. The method of claim 2, wherein measuring the PIM response signature comprises:
    down-converting the PIM produced in response to the excitation waveform to a complex baseband signal; and
    multiplying the complex baseband signal by a counter-rotating vector to remove a frequency sweep in the PIM.

7. The method of claim 6, wherein the PIM response signature comprises the complex baseband signal multiplied by the counter-rotating vector.

8. The method of claim 6, wherein the PIM response signature comprises a group delay characteristic, the group delay characteristic being derived from the complex baseband signal multiplied by the counter-rotating vector.

9. The method of claim 1, wherein the excitation waveform comprises at least a first modulated signal.

10. The method of claim 9, wherein the first modulated signal occupies more than 10% of a passband of the frequency selective device.

11. The method of claim 10, wherein the first modulated signal occupies substantially the whole passband of the frequency selective device and extends into a frequency cut-off region.

12. The method of claim 9, wherein the first modulated signal includes frequencies in a lower frequency cut-off region of a filter characteristic of the frequency selective device, wherein the excitation waveform comprises a second modulated signal including frequencies in an upper frequency cut-off region of a filter characteristic of the frequency selective device, and wherein the excitation waveform comprises an unoccupied frequency band between the first and second modulated signals.

13. The method of claim 9, wherein the measured PIM response signature and each of the plurality of example PIM response signatures represents a time domain characteristic.

14. The method of claim 13, wherein said comparing comprises performing a cross-correlation between the measured PIM response signature and each of the plurality of example PIM response signatures.

15. The method of claim 1, wherein the plurality of example PIM response signatures are measured results determined from frequency selective devices having respective PIM sources located at known locations within the respective frequency selective devices.

16. The method of claim 1, wherein the plurality of example PIM response signatures are simulated results determined from simulations of frequency selective devices having respective PIM sources located at known locations within the respective frequency selective devices.

17. The method of claim 1, wherein the frequency selective device is one of a filter, a duplexer, a combiner and an antenna.

18. The method of claim 1, wherein the excitation waveform comprises an excitation signal applied to a first port of the frequency selective device and a second excitation signal applied to a second port of the frequency selective device.

19. The method of claim 1, wherein the excitation waveform is applied to a first port of the frequency selective device, a second port of the frequency device is terminated with a reflective termination, and the PIM response signature is measured based on PIM signals emitted from the first port.

20. Test apparatus for identifying a location within a frequency selective device of at least one PIM (passive intermodulation) source, the test apparatus comprising:
a signal generator configured to generate an excitation waveform for application to the frequency selective device;
a receiver configured to receive PIM produced in the frequency selective device in response to the excitation waveform; and
a circuit comprising a processor configured to:
measure a PIM response signature of the frequency selective device, the PIM response signature being a characteristic of the PIM received by the receiver;
produce comparison results by comparing the measured PIM response signature with each of a plurality of example PIM response signatures, each of the plurality of example PIM response signatures corresponding to a characteristic of PIM expected for a respective location within the frequency selective device of a PIM source; and
identify the location within the frequency selective device of the at least one PIM source on the basis of the comparison results.

* * * * *